(12) United States Patent
Kubota

(10) Patent No.: US 7,679,284 B2
(45) Date of Patent: Mar. 16, 2010

(54) LIGHT EMITTING DEVICE AND ELECTRONIC APPARATUS

(75) Inventor: Takehiko Kubota, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 217 days.

(21) Appl. No.: 12/024,451

(22) Filed: Feb. 1, 2008

(65) Prior Publication Data

US 2008/0191603 A1    Aug. 14, 2008

(30) Foreign Application Priority Data

Feb. 8, 2007  (JP)  ............................. 2007-028843
Dec. 11, 2007  (JP)  ............................. 2007-319270

(51) Int. Cl.
*H01J 1/62*  (2006.01)

(52) U.S. Cl. ...................... 313/506; 313/498

(58) Field of Classification Search ................ 313/498, 313/505, 506, 509, 512
See application file for complete search history.

(56) References Cited

U.S. PATENT DOCUMENTS 5,936,694 A *  8/1999  Suzuki et al. ............... 349/151

2006/0158095 A1 *  7/2006  Imamura ..................... 313/500

FOREIGN PATENT DOCUMENTS

JP   A-2002-352963   12/2002

* cited by examiner

*Primary Examiner*—Vip Patel
(74) *Attorney, Agent, or Firm*—Oliff & Berridge, PLC

(57) ABSTRACT

A light emitting device includes a substrate, a plurality of light emitting elements, an element layer, an auxiliary electrode, and an insulating layer. An effective region in which the plurality of light emitting elements are arranged and a peripheral region that surrounds the effective region are provided on the substrate. Each of the light emitting elements includes a first electrode, a second electrode and a light emitting layer located between the first electrode and the second electrode. A circuit element is arranged in the element layer to control emission of light of the light emitting elements. The auxiliary electrode is electrically connected to the second electrode. The second electrode covers the effective region and is formed uniformly so as to extend into the peripheral region. The auxiliary electrode extends through a gap between adjacent light emitting elements in the effective region and is formed partly in the peripheral region.

10 Claims, 13 Drawing Sheets

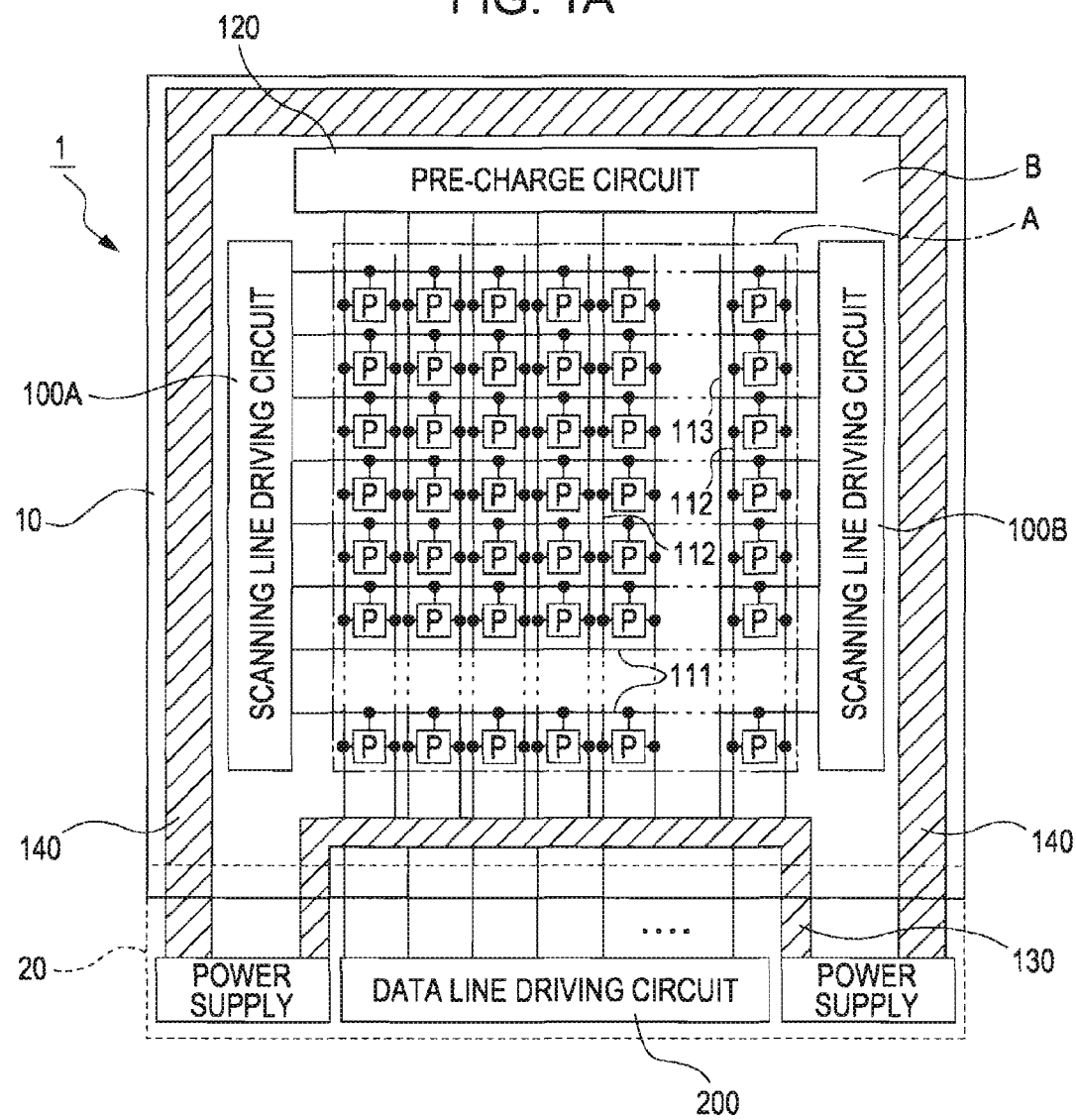

FIG. 14  1, 1A, 1C, 1D, 2A, 3A, 3B, 4A, 4B
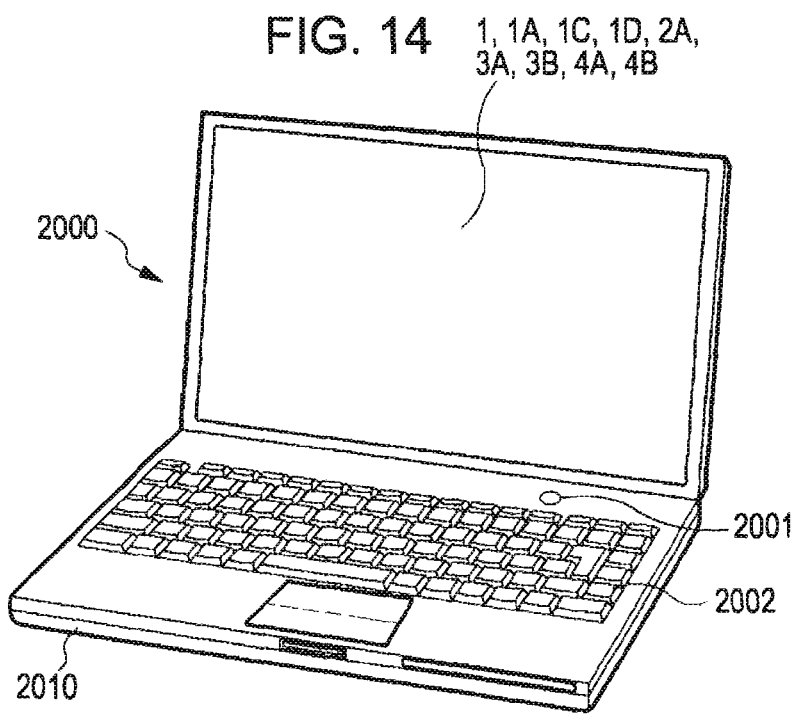
FIG. 15
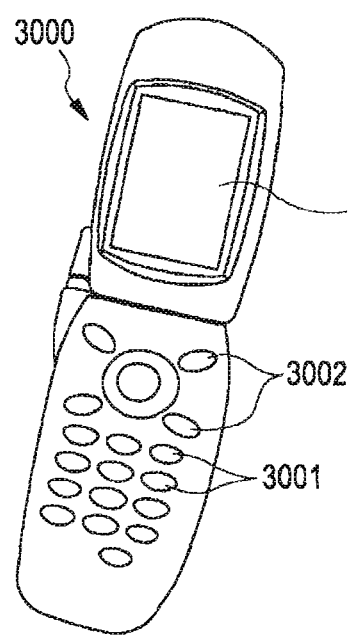
FIG. 16
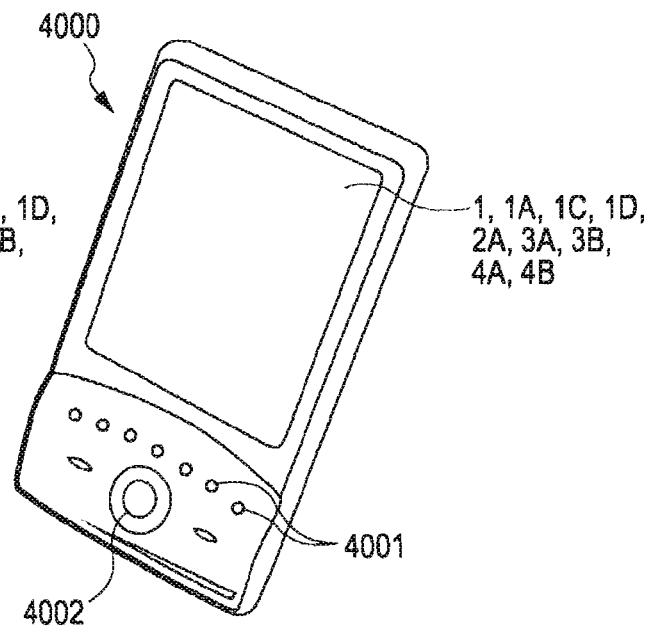

LIGHT EMITTING DEVICE AND ELECTRONIC APPARATUS

BACKGROUND

1. Technical Field

The present invention relates to a light emitting device that uses a light emitting element, such as an organic EL (electroluminescence) element.

2. Related Art

A light emitting device, in which a plurality of light emitting elements are arranged in an effective region on a substrate and various wirings, and the like, are arranged in a peripheral region that surrounds the effective region, has been known. Each of the light emitting elements includes a light emitting layer that is formed of a light emitting material, such as an organic EL material, and that is held between a first electrode and a second electrode. In most cases, the second electrode is a common electrode that is provided commonly for the plurality of light emitting elements and is provided all over the entire effective region. However, there is a possibility that a decrease in voltage will occur along the plane of the electrode because of a resistance of the electrode itself and, then, electric potentials supplied to the light emitting elements will vary depending on a position on the substrate and, therefore, the luminance of the light emitting elements will vary depending on the position. Then, an auxiliary electrode that is formed of a material having a lower resistance than the common electrode and that is electrically connected to the common electrode has been provided in order to reduce the resistance of the common electrode (which is, for example, described in JP-A-2002-352963).

In the meantime, the auxiliary electrode is mostly formed of, for example, a light shielding member, such as aluminum. Therefore, it is desirable that the auxiliary electrode is formed to extend through a region of a gap between the adjacent light emitting elements so as not to block light that exits from the light emitting elements, and also it is desirable that the auxiliary electrode is formed using a highly accurate positioning mechanism. In contrast, the common electrode is formed of an optically transparent material and is formed uniformly in the region that covers the entire effective region. Thus, as compared with the auxiliary electrode, the tolerance of positioning is allowed to form the common electrode. Thus, the tolerance of positioning of the common electrode becomes more problematic than that of the auxiliary electrode. Thus, it is desirable that the width of the peripheral region (so-called "window frame region") is sufficiently ensured on the substrate so that the tolerance of the common electrode may be absorbed. This as been an obstacle to a reduction in size of the device.

In addition, circuit elements, such as transistors, to control emission of light of the light emitting elements are arranged in a lower layer under the common electrode and the auxiliary electrode. For this reason, an insulating layer is provided between the circuit elements and both the common electrode and the auxiliary electrode, so that the common electrode and the auxiliary electrode are insulated from the circuit elements. However, when the insulating layer has a step, there is a possibility that the electrode positioned at an upper layer portion that overlaps the step may break or crack. Because the resistance value of the electrode that has broken or cracked increases, the light emitting elements will have a remarkable luminance non-uniformity.

SUMMARY

An advantage of some aspects of the invention is that it provides a light emitting device that reduces a window frame region of the light emitting device while making it possible to suppress luminance non-uniformity of the light emitting elements.

An aspect of the invention provides a first light emitting device. The first light emitting device includes a substrate, a plurality of light emitting elements, an element layer, an auxiliary electrode, and an insulating layer. An effective region in which the plurality of light emitting elements are arranged and a peripheral region that surrounds the effective region are provided on the substrate. Each of the light emitting elements includes a first electrode, a second electrode and a light emitting layer located between the first electrode and the second electrode. The second electrode is commonly provided for the plurality of light emitting elements. A circuit element is arranged in the element layer to control emission of light of the light emitting elements. The auxiliary electrode is electrically connected to the second electrode. The insulating layer has a portion that is arranged in an upper layer on the element layer and arranged in a lower layer under the second electrode and the auxiliary electrode. The insulating layer insulates the second electrode and the auxiliary electrode from the circuit element. The second electrode covers the effective region and is formed uniformly so as to extend into the peripheral region. The auxiliary electrode extends through a gap formed between the plurality of adjacent light emitting elements in the effective region and is formed partly in the peripheral region. In the peripheral region, an end portion of the second electrode is located on an inner side along a plane of the substrate than an end portion of the auxiliary electrode and an end portion of the insulating layer.

In the light emitting device according to the aspect of the invention, the end portion of the auxiliary electrode is arranged on the outer side than the end portion of the second electrode. In addition, the auxiliary electrode is formed, in the effective region, to extend through a region of a gap formed between the adjacent light emitting elements. Therefore, it is desirable that the auxiliary electrode is formed using a highly accurate positioning mechanism. In contrast, because the second electrode is formed uniformly in a region that covers the entire effective region, when the second electrode is formed, positioning accuracy is not required as high as that of the auxiliary electrode. That is, the auxiliary electrode is mostly formed with a tolerance smaller than that of the second electrode. Thus, according to the aspect of the invention, in comparison with the configuration in which the end portion of the second electrode is arranged on the outer side than the end portion of the auxiliary electrode, it is possible to reduce a window frame region in accordance with the tolerance of the auxiliary electrode. Hence, the size of the device may be reduced. Then, the auxiliary electrode is configured to have a smaller resistance than the second electrode. Specifically, the auxiliary electrode is preferably formed of a material having a lower resistance than that of the second electrode.

Moreover, in the light emitting device according to the aspect of the invention, the end portion of the second electrode is arranged on the inner side than the end portion of the insulating layer. The insulating layer is, for example, a circuit planarizing film and, in most cases, formed to be thick in order to planarize unevenness of the lower layer. Thus, the end portion of the insulating layer forms a large step. In contrast, the second electrode is mostly formed of a fragile material or formed to be thin, so that breakage or crack may occur in the second electrode because of the influence of a step formed at the end portion of the insulating layer. However, in the aspect of the invention, because the end portion of the second electrode is located on the inner side than the end portion of the insulating layer, breakage or crack may be prevented from occurring in the second electrode. Thus, it is possible to obviate an increase in resistance value due to breakage or crack. Thus, it is possible to suppress luminance non-uniformity of the light emitting elements. In the above aspect, the second electrode may be arranged in a lower layer under the auxiliary electrode. According to this aspect, the second electrode may be protected from ambient air.

Moreover, another aspect of the invention provides a second light emitting device. The second light emitting device includes a substrate, a plurality of light emitting elements, a plurality of first electrodes, a second electrode, a light emitting layer, an auxiliary electrode, an element layer and an insulating layer. An effective region in which the plurality of light emitting elements are arranged and a peripheral region that surrounds the effective region are provided on the substrate. The plurality of first electrodes are provided at positions corresponding to the plurality of light emitting elements. The second electrode is provided commonly for the plurality of light emitting elements. The light emitting layer is interposed between the plurality of first electrodes and the second electrode. The auxiliary electrode is electrically connected to the second electrode. A circuit element that controls emission of light of the light emitting elements is arranged in the element layer. The insulating layer insulates the second electrode or the auxiliary electrode from the element layer. The second electrode is provided in a first region that includes the entire effective region and at least part of the peripheral region. The insulating layer is provided in a second region that overlaps the first region over the entire effective region and that extends beyond the first region in a first direction on the peripheral region. The auxiliary electrode is provided to extend through a gap formed between the adjacent light emitting elements in the effective region. In the peripheral region, the auxiliary electrode is provided inside the first region and provided to extend through a region, which is located on the outer side than the first region and inside the second region, outward beyond the second region.

In the above second light emitting device, the auxiliary electrode is also provided in a region that is located on the outer side than the first region in which the second electrode is provided. Thus, the end portion of the auxiliary electrode is arranged on the outer side than the end portion of the second electrode. In addition, in the effective region, the auxiliary electrode is formed to extend through a region of a gap formed between the adjacent light emitting elements, so that highly accurate positioning mechanism is used to form the auxiliary electrode. In contrast, because the second electrode is formed uniformly in a region that covers the entire effective region, when the second electrode is formed, positioning accuracy is not required as high as that of the auxiliary electrode. Thus, because the tolerance of the auxiliary electrode is smaller than the second electrode, according to the aspect of the invention, in comparison with the configuration in which the end portion of the second electrode is arranged on the outer side than the end portion of the auxiliary electrode, it is possible to reduce a window frame region in accordance with the tolerance of the auxiliary electrode. Hence, the size of the device may be reduced.

Furthermore, in the above second light emitting device, the first region in which the second electrode is provided is arranged inside the second region in which the insulating layer is provided. Thus, at a portion at which the end portion of the insulating layer overlaps the second electrode, it is possible to obviate an increase in resistance value due to breakage or crack that may occur in the second electrode. Hence, it is possible to suppress luminance non-uniformity of the light emitting elements.

In the second light emitting device according to the aspect of the invention, the plurality of light emitting elements may be arranged in a matrix, wherein the auxiliary electrode may include a plurality of individual electrodes that are provided in a stripe along a first direction so as to extend through a gap formed between the plurality of adjacent light emitting elements from an inside of the effective region outward beyond the effective region. More specifically, the auxiliary electrode may further include a connecting electrode in the peripheral region, wherein the connecting electrode connects the plurality of individual electrodes. In this case, the connecting electrode may be arranged so that an end portion of the insulating layer in the first direction overlaps the connecting electrode.

In the second light emitting device according to the aspect of the invention, the plurality of light emitting elements may be arranged in a matrix, wherein the auxiliary electrode may include a plurality of individual electrodes that are provided in a stripe along the first direction so as to extend through a gap formed between the plurality of adjacent light emitting elements from an inside of the effective region outward beyond the second region.

In addition, in the second light emitting device according to any one of the above described aspects of the invention, a second electrode power supply line that supplies an electric potential to the second electrode may be provided in the peripheral region so as to intersect with the first direction, and the second electrode power supply line may be electrically connected to the auxiliary electrode. In this case, the second electrode power supply line may be provided on an outer side than the first region. Furthermore, yet another aspect of the invention provides an electronic apparatus that includes the first or second light emitting device according to any one of the above described aspects of the invention. According to the electronic apparatus, at least any one of the above described advantageous effects may be achieved.

BRIEF DESCRIPTION OF THE DRAWINGS

The invention will be described with reference to the accompanying drawings, wherein like numbers reference like elements.

FIG. 1A is a schematic plan view of part of the configuration of a light emitting device according to a first embodiment of the invention.

FIG. 14 is a perspective view of the configuration of a mobile personal computer that employs a light emitting device.

FIG. 15 is a perspective view of the configuration of a cellular phone to which a light emitting device is applied.

FIG. 16 is a perspective view of the configuration of a personal digital assistants to which a light emitting device is applied.

DESCRIPTION OF EXEMPLARY EMBODIMENTS

Figure 1B:
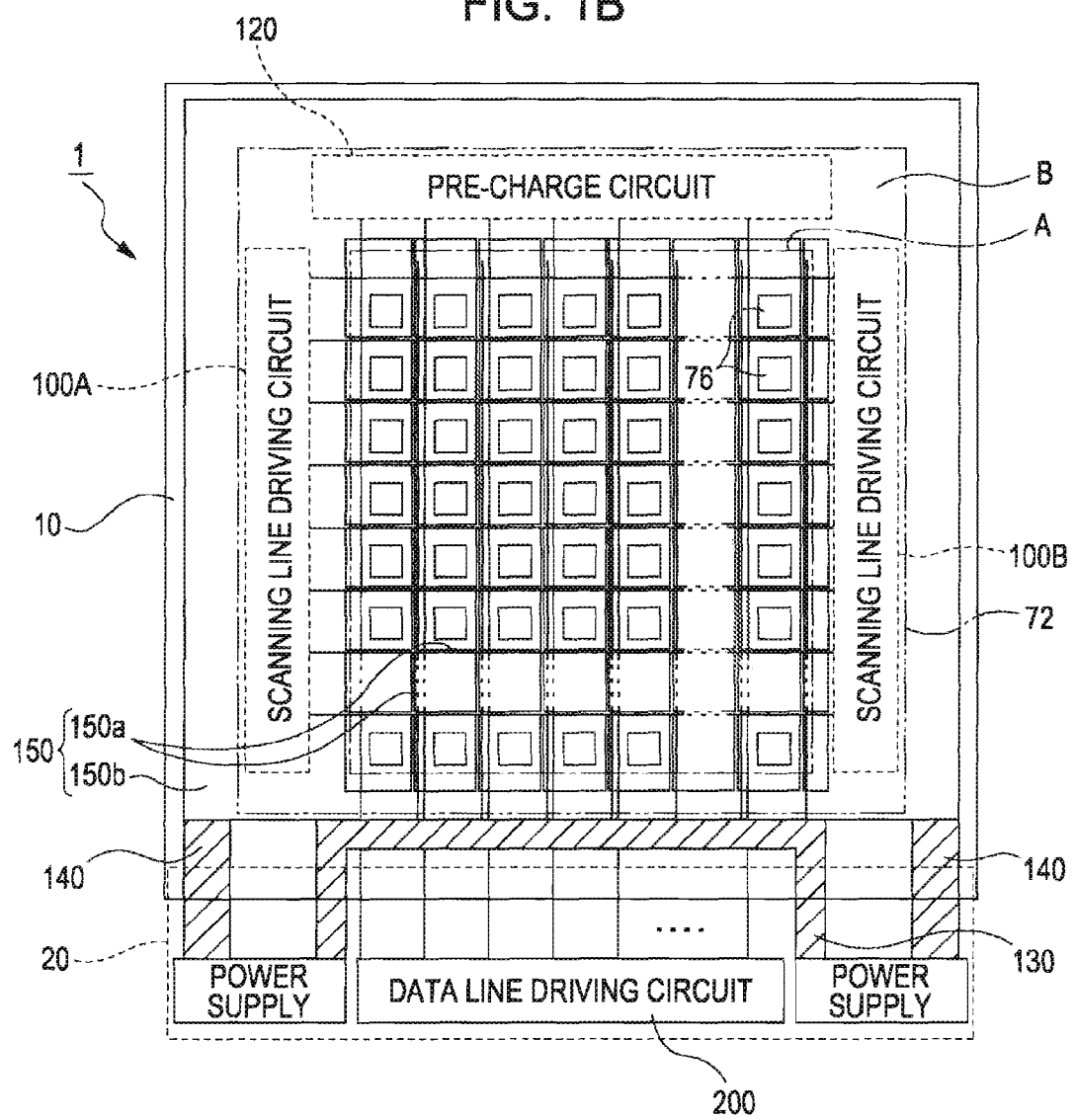
FIG. 1B is a plan view that shows a state where an auxiliary electrode and pixel electrodes are further formed in addition to the state shown in FIG. 1.

Hereinafter, embodiments according to the invention will be described with reference to the accompanying drawings. Note that, in the drawings, the ratios of the dimensions of the components are appropriately varied from those of the actual components.

A-1: First Embodiment

FIG. 1A is a schematic plan view of part of the configuration of a light emitting device 1 according to a first embodiment of the invention. FIG. 1B is a plan view that shows a state where an auxiliary electrode 150 and pixel electrodes 76 are further formed in addition to the state shown in FIG. 1A. As shown in FIG. 1A, the light emitting device 1 includes a substrate 10 and a flexible substrate 20. A connecting terminal is formed at an end portion of the substrate 10. The connecting terminal is fixedly compression-bonded to a connecting terminal, which is formed on the flexible substrate 20, through a film adhesive, which is called an ACF (anisotropic conductive film), that contains conductive particles. In addition, a data line driving circuit 200 is provided on the flexible substrate 20, and various power supply voltages are supplied through the flexible substrate 20 to the substrate 10.

An effective region A and a peripheral region B that is located outside the effective region A (that is, on the substrate or between the outer periphery of the substrate 10 and the effective region A) are provided on the substrate 10. Scanning line driving circuits 100A and 100B and a pre-charge circuit 120 are formed in the peripheral region B. The pre-charge circuit 120 is a circuit that sets the electric potentials of data lines 112 to a predetermined electric potential in advance of writing operation. The scanning line driving circuits 100A and 100B and the pre-charge circuit 120 are peripheral circuits that are located on the peripheral side of the effective region A. However, the peripheral circuit may include a detection circuit (not shown) that detects the quality of unit circuits P and/or the quality of wirings. Furthermore, the data line driving circuit 200 may serve as a peripheral circuit that is provided in the peripheral region B.

A plurality of scanning lines 111 and a plurality of data lines 112 are formed in the effective region A, and a plurality of unit circuits (pixel circuits) P each are provided in proximity to a corresponding one of intersections of the scanning lines 111 and the data lines 112. Each of the unit circuits P includes an OLED (organic light emitting diode) element and is supplied with power from a corresponding one of electric current supply lines 113. A plurality of the electric current supply lines 113 are connected to a first electrode power supply line 130.

Figure 2:
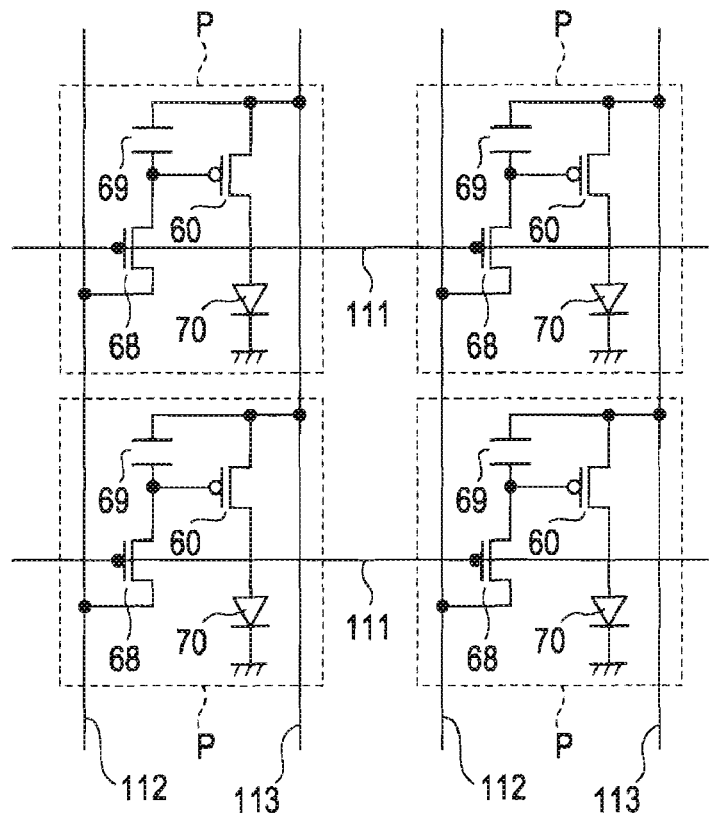
FIG. 2 is a circuit diagram that shows the details of pixel circuits of the light emitting device.

FIG. 2 is a circuit diagram that shows the details of the unit circuits P of the light emitting device 1. Each of the unit circuits P includes an n-channel transistor 68, a p-channel transistor 60, a capacitive element 69 and a light emitting element (OLED element) 70. The source electrode of the p-channel transistor 60 is connected to the corresponding electric current supply line 113, and the drain electrode thereof is connected to the anode of the light emitting element 70. In addition, the capacitive element 69 is provided between the source electrode and gate electrode of the transistor 60. The gate electrode of the n-channel transistor 68 is connected to the corresponding scanning line 111, the source electrode thereof is connected to the corresponding data line 112 and, then, the drain electrode thereof is connected to the gate electrode of the transistor 60.

Each of the unit circuits P, when the scanning line 111 corresponding to that unit circuit P is selected by the scanning line driving circuits 100A and 100B, turns on the transistor 68 and then holds a data signal, supplied through the corresponding data line 112, in the internal capacitive element 69. After that, the transistor 60 supplies the light emitting element 70 with an electric current corresponding to the level of the data signal. In this manner, each of the light emitting elements 70 emits light with a luminance corresponding to the level of the data signal.

In addition, as shown in FIG. 1A, a U-shaped second electrode power supply line 140 is formed on an outer peripheral portion side of the peripheral region B (that is, on the substrate or between the outer periphery of the substrate 10 and the peripheral region B). The second electrode power supply line 140, as will be described later, is a wiring that is used to supply a power supply voltage (in this example, Vss: ground level) to the cathode (second electrode) of each of the light emitting elements. Note that instead of arranging the second electrode power supply line 140 in a U shape (that is, along three sides of the substrate 10), the second electrode power supply line 140 may be provided along two opposite sides of the substrate 10. That is, in the example shown in the drawing, the second electrode power supply line 140 may be arranged along each of the scanning line driving circuits 100A and 100B.

Figure 3:
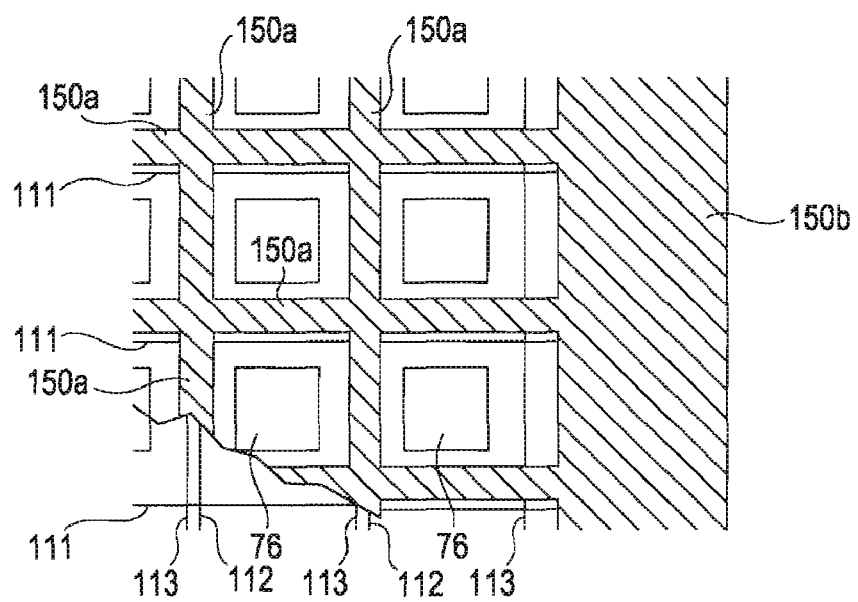
FIG. 3 is a partially enlarged view of FIG. 1B.
Figure 4:
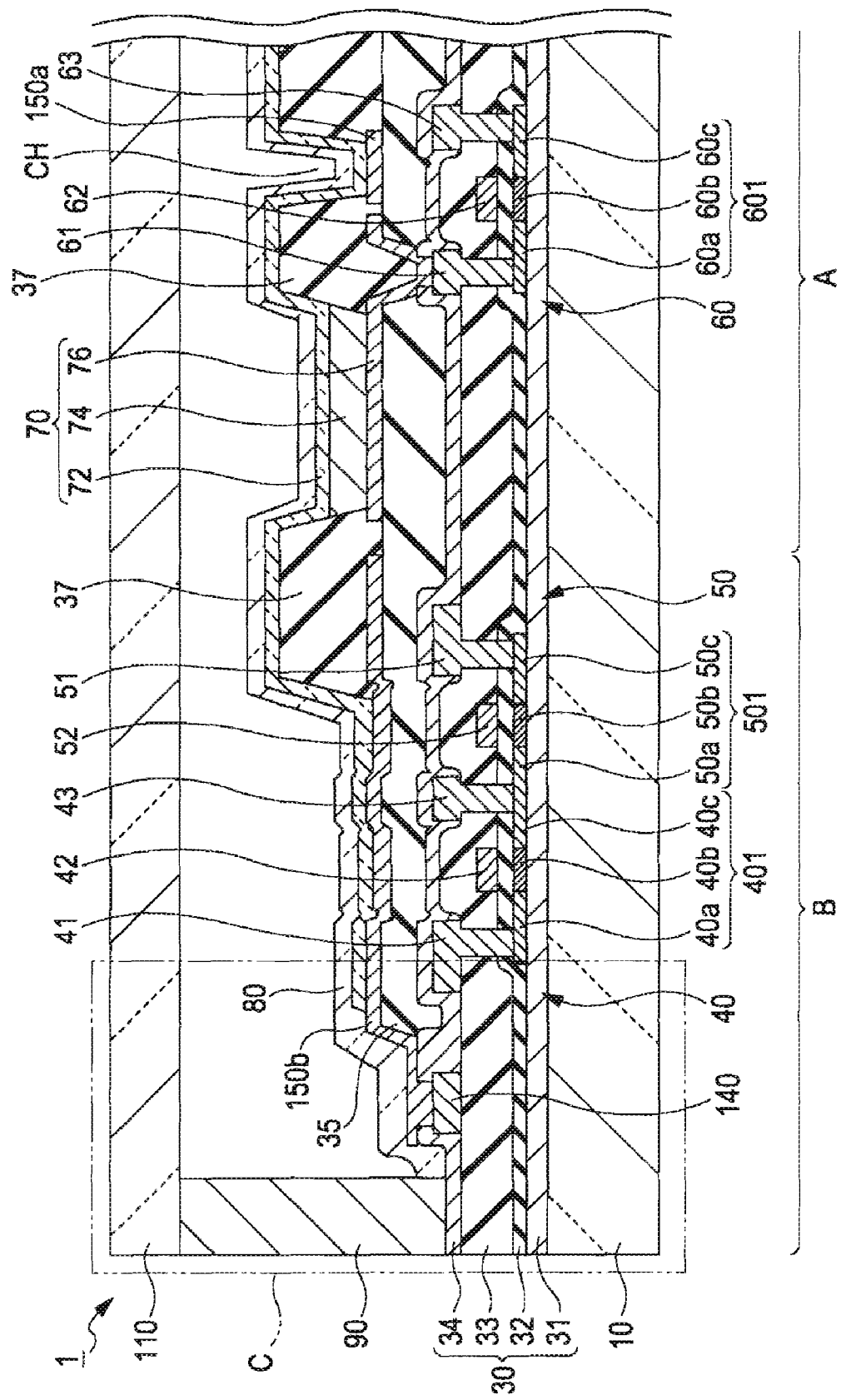
FIG. 4 is a partially cross-sectional view of the light emitting device.

As shown in FIG. 4, each of the light emitting elements 70 has a light emitting function layer (including a light emitting layer) that is held between the pixel electrode 76 (anode) and the common electrode 72 (cathode). The common electrode 72 is formed in a region (first region) that extends over the entire effective region A and part of the peripheral region B, as shown in FIG. 1B. In addition, the auxiliary electrode 150 that connects the common electrode 72 and the second electrode power supply line 140 is formed in the peripheral region B so as to cover the peripheral circuit. The auxiliary electrode 150 includes a first portion 150a provided in the effective region A and a second portion 150b provided in the peripheral region B. In the effective region A, the first portion 150a of the auxiliary electrode 150 is formed in a grid so that the first portion 150a does not contact the pixel electrodes 76. That is, the first portion 150a of the auxiliary electrode 150 is arranged in a gap between the adjacent light emitting elements 70. The "auxiliary electrode" in the description is a connector that is arranged to overlap the common electrode 72 and electrically connected to the common electrode 72 and that reduces a resistance of the common electrode 72. For the purpose of clarity, FIG. 3 is a partially enlarged view of FIG. 1B.

The light emitting device 1 of this embodiment is of a top-emission-type, in which light emitted from the light emitting function layer 74 exits through the common electrode 72. The common electrode 72 is formed of a transparent material. For this reason, the common electrode 72 cannot shield the peripheral region B. On the other hand, because the above described auxiliary electrode 150 is formed of a conductive and light shielding metal, the auxiliary electrode 150 is able to block light. In this manner, it is possible to suppress generation of a photoelectric current because of light that enters the peripheral circuit. In addition, the auxiliary electrode 150 may be formed in the same process as the pixel electrodes 76 in the effective region A. Thus, no additional process is required to add a light shielding property to the peripheral region B.

FIG. 4 is a partially cross-sectional view of the light emitting device 1. In the drawing, the light emitting elements 70 are formed in the effective region A, while, on the other hand, the scanning line driving circuit 100A, which serves as the peripheral circuit, is formed in the peripheral region B. In the drawing, the upper face of the light emitting device 1 corresponds to a light exit plane through which light exits. As shown in the drawing, a base protection layer 31 is formed on the substrate 10, and transistors 40, 50, and 60 are formed thereon. The transistor 40 is of an n-channel type, and the transistors 50 and 60 each are of a p-channel type. The transistors 40 and 50 are part of the scanning line driving circuit 100A, and the transistor 60 and the light emitting element 70 are part of the unit circuit P.

The transistors 40, 50, and 60 are provided on the base protection layer 31, which is formed on the surface of the substrate 10 and mainly contains silicon oxide. Silicon layers 401, 501, and 601 are formed in an upper layer on the base protection layer 31. A gate insulating layer 32 is provided in an upper layer on the base protection layer 31 so as to cover the silicon layers 401, 501, and 601. The gate insulating layer 32 is, for example, formed of silicon oxide. Gate electrodes 42, 52, and 62 are provided on the upper face of the gate insulating layer 32 at portions that face the silicon layers 401, 501, and 601, respectively. A group V element is doped into the silicon layer 401 of the transistor 40 via the gate electrode 42 and, thereby, a drain region 40c and a source region 40a are formed. Here, a region in which a group V element is not doped corresponds to a channel region 40b.

A group III element is doped into the silicon layer 501 of the transistor 50 via the gate electrode 52 and, thereby, a drain region 50a and a source region 50c are formed. Similarly, a group III element is doped into the silicon layer 601 of the transistor 60 via the gate electrode 62 and, thereby, a drain region 60a and a source region 60c are formed. Here, regions in which a group III element is not doped correspond to channel regions 50b and 60b, respectively. Note that the scanning lines 111 are formed at the same time when the gate electrodes 42, 52, and 62 of the transistors 40, 50, and 60 are formed.

A first interlayer insulating layer 33 is formed in an upper layer on the gate insulating layer 32 so as to cover the gate electrodes 42, 52, and 62. The material of the first interlayer insulating layer 33 employs silicon oxide, or the like. Furthermore, source electrodes 41, 51, and 63, a drain/source electrode 43, and a drain electrode 61 are connected to the silicon layers 401, 501, and 601 through contact holes that are formed to extend through the gate insulating layer 32 and the first interlayer insulating layer 33. In addition, in the same process for forming these electrodes, the second electrode power supply line 140, the data lines 112 and the electric current supply lines 113 are formed. These electrodes, the second electrode power supply line 140, and the like, are formed of a conductive material, such as aluminum.

A circuit protection film 34 is formed in an upper layer on the first interlayer insulating layer 33 so as to cover the source electrodes 41, 51, and 63, the drain/source electrode 43, the drain electrode 61, and the second electrode power supply line 140. The circuit protection film 34 is, for example, formed of a material, such as silicon nitride or silicon oxynitride, having a low gas permeability. In addition, these silicon nitride and silicon oxynitride may be an amorphous material or may contain hydrogen. The circuit protection film 34 is able to prevent hydrogen from leaving from the transistors 40, 50, and 60. Note that the circuit protection film 34 may be formed below the source electrodes and/or the drain electrodes.

A second interlayer insulating film 35 is formed in an upper layer on the circuit protection film 34. Here, the second interlayer insulating film 35 is provided between the source electrodes 41, 51, and 63, drain/source electrode 43, drain electrode 61 and second electrode power supply line 140 and the pixel electrode 76, auxiliary electrode 150 or common electrode 72, which will be described later, and serves to insulate these elements. At this time, the thickness of the second interlayer insulating film 35 is set so that signals supplied to the scanning lines or the signal lines do not delay. Note that the second interlayer insulating film 35 is preferably formed so that the upper face, which is on the opposite side with respect to the circuit protection film 34, has a smaller unevenness than the lower face that faces the circuit protection film 34. That is, the second interlayer insulating film 35 is used to planarize the unevenness formed by the transistors 40, 50, and 60, the scanning lines 111, the data lines 112, the electric current supply lines 113, and the like. This second interlayer insulating film 35 is provided in a second region that overlaps the above described first region (the region in which the common electrode 72 is formed) over the entire effective region A and extends in a first direction beyond the first region in the peripheral region B. Specifically, in the present embodiment, among the four sides of the substrate 10, in at least three sides including both right and left sides and upper side along which the second electrode power supply line 140 is arranged, the second region extends outward beyond the first region along the plane of the substrate 10.

The material of the second interlayer insulating film 35 employs, for example, an acrylic-based or polyimide-based organic polymer material. In this case, the patterning may be performed in such a manner that a photosensitive material for patterning is mixed with an organic resin and then exposed as in the case of photoresist. Alternatively, the patterning may be performed in such a manner that the second interlayer insulating film 35 is formed of an inorganic material, such as silicon oxide or silicon oxynitride, by means of chemical vapor deposition (CVD) and the upper face thereof is then planarized. The inorganic material, when its film is formed by means of chemical vapor deposition, has a thickness equal to or smaller than 1 μm and is substantially uniform. Therefore, the upper face is easily affected by the unevenness of the lower layer. On the other hand, the organic resin is formed by coating, so that the thickness thereof may be larger, approximately 2 to 3 μm, and, thereby, the upper face thereof is hardly affected by the unevenness of the lower layer. Thus, the organic resin is suitable for the material of the second interlayer insulating film 35. However, when a certain amount of unevenness is allowed, the inorganic material, such as silicon oxide or silicon oxynitride, may be used for the second interlayer insulating film 35. As described above, the second interlayer insulating film needs to have a predetermined thickness, so that there is a possibility that a step may be formed in the peripheral region.

On the second interlayer insulating film 35, the pixel electrode 76 (first electrode) and the first portion 150a of the auxiliary electrode are formed in the effective region A, while, at the same time, the second portion 150b of the auxiliary electrode is formed in the peripheral region B. That is, the pixel electrodes 76 and the auxiliary electrode 150 are formed at the same time in the same layer using the same material. Each of the pixel electrodes 76 in the present embodiment is formed in the corresponding light emitting element 70 and serves as the anode of the light emitting element 70. The pixel electrodes 76 are spaced apart from one another. Each of the pixel electrodes 76 is connected to the drain electrode 61 of the transistor 60 through a contact hole that is formed to extend through the second interlayer insulating film 35 and the circuit protection film 34. In addition, the material of the pixel electrode 76, which serves as an anode, is desirably a material having a larger work function and is preferably, for example, nickel, gold, platinum or the like, or an alloy of them. These materials have reflectivity, so that light emitted from the light emitting function layer 74 is reflected toward the common electrode 72. In this case, the auxiliary electrode 150 is also formed of these materials.

In addition, the pixel electrode 76 may be formed to include an optically transparent and conductive first layer formed of a conductive oxide material, such as ITO (indium tin oxide) IZO (indium zinc oxide), or $ZnO_2$, which has a larger work function, and a second layer formed of a reflective metal, such as aluminum, for example, and then the first layer is provided on a side on which the light emitting function layer is provided. In this case, the auxiliary electrode 150 may include both the first layer and the second layer, or may include any one of these layers.

The auxiliary electrode 150 is formed, in the effective region A, in a grid so as to extend through a gap formed between the plurality of adjacent light emitting elements 70 (first portion 150a) and is formed, in the peripheral region B, so as to extend through a region located inside the first region and a region located outside the first region and inside the second region (second portion 150b) on a side on which the second region, in which the second interlayer insulating film 35 is formed, extends beyond the first region in which the common electrode 72 is formed (in the present embodiment, on the right and left sides and upper side of the substrate The auxiliary electrode 150 is, in the peripheral region B, connected to the second electrode power supply line 140 through a contact hole that is formed to extend through the circuit protection film 34. As shown in the drawing, the second interlayer insulating film 35 is not formed on the second electrode power supply line 140 but the contact hole is formed in the circuit protection film 34 only, so that it is possible to bring the second portion 150b of the auxiliary electrode 150 in direct contact with the second electrode power supply line 140.

Next, the partition wall 37 is formed. The partition wall 37 is formed so that the partition wall 37 covers the outer periphery of each pixel electrode 76, so that the partition wall 37 has an opening 37a formed therein. Thus, the entire region of each opening 37a overlaps the corresponding pixel electrode 76, and, in the process before the light emitting function layer 74 is formed, the pixel electrodes 76 are exposed through the openings 37a. The partition wall 37 is used to insulate the pixel electrodes 76 from the common electrode 72 (second electrode), which is formed after the pixel electrodes 76 are formed, and to insulate the plurality of adjacent pixel electrodes 76. By providing the partition wall 37, it is possible to separately control the pixel electrodes 76 and, thereby, possible to have the plurality of light emitting elements emit light with respective predetermined luminances. That is, the partition wall 37 partitions the plurality of light emitting elements. For example, acrylic, polyimide, or the like, may be used for the insulating material of the partition wall 37. In this case, the patterning may be performed in such a manner that a photosensitive material is mixed and then exposed as in the case of photoresist. A contact hole CH is formed in the partition wall 37 at the same time. In the effective region A, the first portion 150a of the auxiliary electrode 150 is connected to the common electrode 72, which will be described later, through the contact hole CH. In addition, in the peripheral region B, no same layer as the partition wall 37 is formed on the second portion 150b of the auxiliary electrode 150.

Next, the light emitting function layer 74 that at least includes a light emitting layer is formed on the pixel electrode 76. An organic EL material is used for the light emitting layer. The organic EL material may be a low polymer material or may be a high polymer material. Part or all of a hole injection layer, a hole transport layer, an electron transport layer, an electron injection layer, a hole blocking layer and an electron blocking layer may be provided as another layer that constitutes the light emitting function layer 74.

Next, the common electrode 72 (second electrode) is formed to extend over the effective region A and the peripheral region B so as to cover the auxiliary electrode 150 and the light emitting function layer 74. The common electrode 72 is translucent. Light emitted from the light emitting element 70 exits in a direction toward the upper side of the drawing through the common electrode 72. In order for the common electrode 72 of the present embodiment to function as a cathode of all the light emitting elements 70, the common electrode 72 is formed of a material having a small work function so as to easily inject electrons. The material of the common electrode 72 may be, for example, aluminum, calcium, magnesium, lithium, or the like, or an alloy of them. In addition, the alloy may desirably include a first material having a small work function and a second material that stabilizes the first material. For example, an alloy of magnesium and silver is suitable. When these metals or alloys are used as the common electrode 72, the thickness is made smaller to obtain translucency.

In addition, the common electrode 72 (second electrode) may be formed to include a first layer formed of a material having a smaller work function described above or formed of a first material having a smaller work function and a second material that stabilizes the first material and an optically transparent and conductive second layer formed of a conductive oxide material, such as ITO (indium tin oxide), IZO (indium zinc oxide), or $ZnO_2$, and then the first layer is provided on a side on which the light emitting function layer is provided. The conductive oxide material, such as ITO, IZO or $ZnO_2$, is a dense material and has a low gas permeability. When the common electrode 72 is formed of the above material, because the common electrode 72 is formed to extend over the effective region A and the peripheral region B, the unit circuits P in the effective region A and the peripheral circuits in the peripheral region B are protected from ambient air. Thus, degradation of these elements are suppressed. In this manner, when the common electrode 72 (second electrode) is configured to include the above second layer, the material that forms the second layer has a higher translucency and a higher conductivity than the material that forms the first layer, it is possible to largely reduce the source impedance of the common electrode 72 and also possible to improve the efficiency by which light is taken out from the light emitting function layer. In addition, the common electrode 72 (second electrode) is configured to include a first layer formed of a first material having a smaller work function and a second material that stabilizes the first material, and a second layer formed of the above described conductive oxide material. Thus, it is possible to prevent deterioration of the efficiency of electron injection because of reaction of the first layer and the second layer.

In addition, in advance of forming the common electrode 72, the contact hole CH is formed in the partition wall 37. The first portion 150a of the auxiliary electrode and the common electrode 72 are connected in the effective region A through the contact hole CH. When the common electrode 72 is connected to the first portion 150a (see FIG. 1B) of the auxiliary electrode, which is formed in a grid in the effective region A, it is possible to largely reduce the source impedance of the common electrode 72. In addition to this, because the second portion 150b of the auxiliary electrode is not covered with the partition wall 37 in the peripheral region B, the second portion 150b is in contact with the common electrode 72 with a large area. Thus, it is possible to reduce the connection resistance. Thus, it is possible to largely reduce the source impedance.

Next, a sealing film 80 is formed to cover the common electrode 72 and the auxiliary electrode 150. The sealing film 80, for example, employs an inorganic material having a low gas permeability, such as silicon oxynitride or silicon oxide, which has a high translucency and a high moisture-proof property. The sealing film 80 covers the entire region of the peripheral circuits (the scanning line driving circuits 100A and 100B that include the transistors 40 and 50 and the precharge circuit 120). However, the sealing film 80 is not formed at the outer periphery of the substrate 10 and, at this outer periphery, a seal 90 is bonded onto the circuit protection film 34 and a transparent sealing substrate (opposite substrate) 110 is further bonded thereon. The seal 90 may be, for example, an adhesive or may be formed by bonding a spacer that retains the opposite substrate 110 by means of an adhesive.

Figure 5:
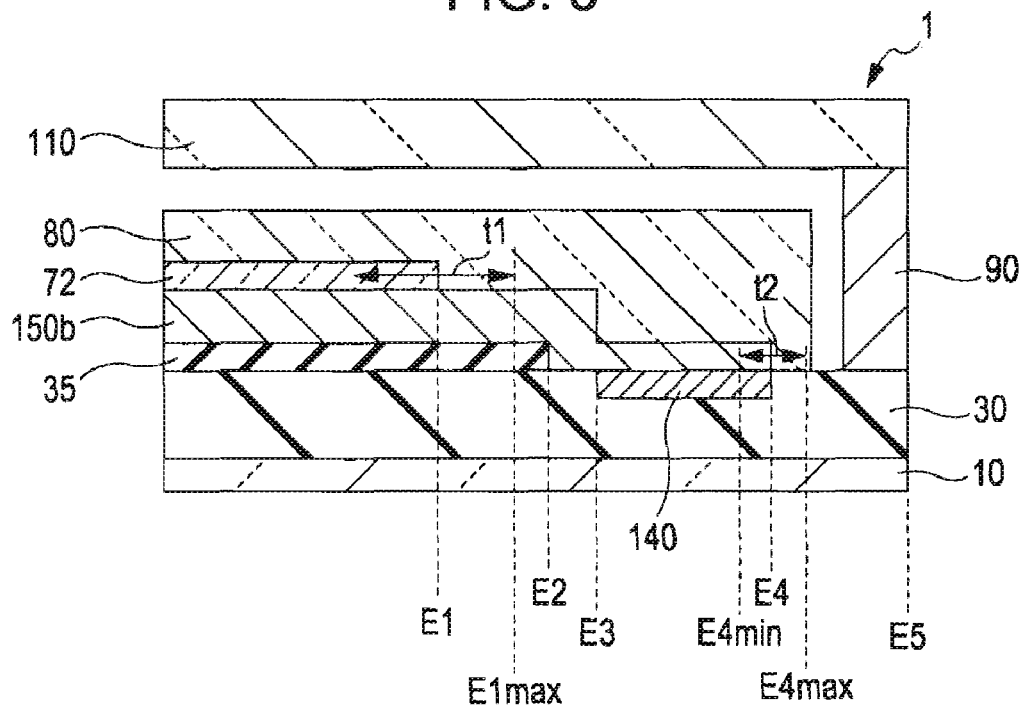
FIG. 5 is a partially schematic cross-sectional view of the light emitting device.

FIG. 5 is a schematic cross-sectional view of a region C shown in FIG. 4. That is, FIG. 5 is a cross-sectional view of an end portion of the peripheral region B, outside the transistors 40 and 50, which are part of the scanning line driving circuit 100. For easier description, the base protection layer 31, the gate insulating layer 32, the first interlayer insulating layer 33, the circuit protection film 34, shown in FIG. 4, and electrodes of the transistors 40, 50 and 60 held between the above layers are collectively shown as an element layer 30 FIG. 5. The second electrode power supply line 140 is formed in an upper layer portion of the element layer 30 and, as described above, the upper face of the second electrode power supply line 140 functions as a contact region with an electrode formed in an upper layer. In FIG. 4, in addition to the element layer 30 and the second electrode power supply line 140, the second interlayer insulating film 35, the auxiliary electrode 150, the common electrode 72, the sealing film 80, the seal 90 and the opposite substrate 110 are shown. Hereinafter, with reference to the above drawing, the relative positional relationship among the layers will be described in detail. Note that, as described above, the second interlayer insulating film 35 is used to planarize the unevenness formed by transistors, wirings, and the like, arranged in the lower layer. In addition, the second interlayer insulating film 35 is formed of an acrylic-based or polyimide-based electrically insulative organic high polymer material, and the second interlayer insulating film 35 has a function to insulate electrodes, such as the anode 76, the common electrode 72, and the auxiliary electrode 150, from circuit elements, such as the transistors 40, 50, and 60 arranged in the element layer 30. That is, the second interlayer insulating film 35 functions as an insulating layer that insulates the electrodes from circuit elements that control emission of light of the light emitting elements.

As shown in FIG. 5, the second interlayer insulating film 35 is formed in an upper layer on the element layer 30, including the second electrode power supply line 140, and an end portion E2 of the second interlayer insulating film 35 is located on the further inner side than an inner end portion E3 of the contact region of the second electrode power supply line 140. The second portion 150b (hereinafter, simply referred to as "auxiliary electrode 150") of the auxiliary electrode 150 is formed on the upper face of the second interlayer insulating film 35, in a region held, within the upper face of the element layer 30, between the end portion E2 of the second interlayer insulating film 35 and the end portion E3 and in the contact region. Thus, the auxiliary electrode 150 contacts and overlaps the second electrode power supply line 140 and is electrically connected to the second electrode power supply line 140. In the example shown in the drawing, an end portion E4 of the auxiliary electrode 150 coincides with the outer end portion of the contact region; however, it is not necessary for the end portion E4 to coincide with the outer end portion of the contact region. It is only necessary that the auxiliary electrode 150 is formed to cover the contact region. That is, the end portion E4 of the auxiliary electrode may be located on the further outer side than the outer end portion of the contact region. Note that, in the description, "inner side" and "outer side" indicate relative positions along the plane of the substrate when an end portion E5 of the substrate 10 is set as a reference. Thus, for example, the phrase "the end portion E1 is located on the inner side than the end portion E" indicates that the distance between the end portion E1 and the end portion E5 of the substrate 10 is longer than the distance between the end portion E2 and the end portion E5.

The common electrode 72 is formed on the auxiliary electrode 150. The end portion E1 of the common electrode 72 is formed to be located on the inner side than the end portion E2 of the second interlayer insulating film 35. In addition, the end portion E4 of the auxiliary electrode 150 is formed to be located on the outer side than the end portion E1 of the common electrode 72. Note that, as described above, the auxiliary electrode 150 is formed at the same time with the pixel electrodes 76 and, subsequently, the partition wall 37 and the light emitting function layer 74 are sequentially formed. After that, the common electrode 72) is formed to cover the partition wall 37 and the light emitting function layers 74.

As described above, the auxiliary electrode 150 employs a conductive and light shielding metal. Therefore, the first portion 150a of the auxiliary electrode 150 is formed in a grid so that the auxiliary electrode 150 does not overlap the pixel electrodes 76 in the effective region A. That is, in the effective region A, in order not to block light that exits from the light emitting elements 70, the first portion 150a of the auxiliary electrode 150 is arranged only in a gap formed between the adjacent light emitting elements 70. The light emitting elements 70 are arranged at small intervals between the adjacent light emitting elements 70, so that the auxiliary electrode 150 is desirably formed using a highly accurate alignment mechanism. In contrast, the common electrode 72 is formed of a transparent material and is formed uniformly in the effective region A so as to cover the light emitting elements 70 in the effective region A. Therefore, the common electrode 72 may be formed using an alignment mechanism that is lower in accuracy than that used for forming the auxiliary electrode 150. However, when the common electrode 72 is formed using an alignment mechanism with low accuracy, there is a possibility that the position of the end portion E1 of the common electrode 72 may change.

Now, the range of tolerance of the position of the end portion E1 of the common electrode 72 is represented by t1, and the range of tolerance of the position of the end portion E4 of the auxiliary electrode 150 is represented by t2. When the highly accurate alignment mechanism is used for the auxiliary electrode 150, t1 is wider than t2 (t1>t2). When the single alignment mechanism having such an accuracy that is required to form the auxiliary electrode 150 is used for both the auxiliary electrode 150 and the common electrode 72, t1 is substantially equal to t2 (substantially, t1=t2). Thus, it is less likely that the tolerance t2 of the auxiliary electrode 150 is larger than the tolerance of the common electrode 72. If t1 is narrower than t2 (t1<t2) in the latter case, because the highly accurate alignment mechanism is used, the tolerance t1 does not become a big problem. Then, in the present embodiment, the end portion E4 of the auxiliary electrode 150 is located on the outer side than the end portion E1 of the common electrode 72. According to this configuration, the width of the peripheral region B (that is, "window frame region") may be determined by taking into consideration a distance from a portion E4max, at which the tolerance of the auxiliary electrode 150 is maximum on the side adjacent to the end portion E5 of the substrate 10 (a position where the end portion E4 is located closest to the end portion E5 of the substrate 10), to the end portion E5. Thus, in comparison with the case where the end portion E1 of the common electrode 72 that allows a wider tolerance is arranged on the outer side than the end portion E4 of the auxiliary electrode 150, it is possible to reduce the window frame region. That is, it is possible to reduce the influence of accuracy of the alignment mechanism used for forming the common electrode 72 on the width of the window frame region. Note that the reference position of the end portion E1 and the reference position of the end portion E4 (the reference position is a position when there is no tolerance) are desirably determined so that the position E1max, at which the tolerance of the common electrode 72 is maximum on the side adjacent to the end portion E5 of the substrate 10, is located on the inner side than the position E4max, at which the tolerance of the auxiliary electrode 150 is maximum on the side adjacent to the end portion E5 of the substrate 10.

Figure 6:
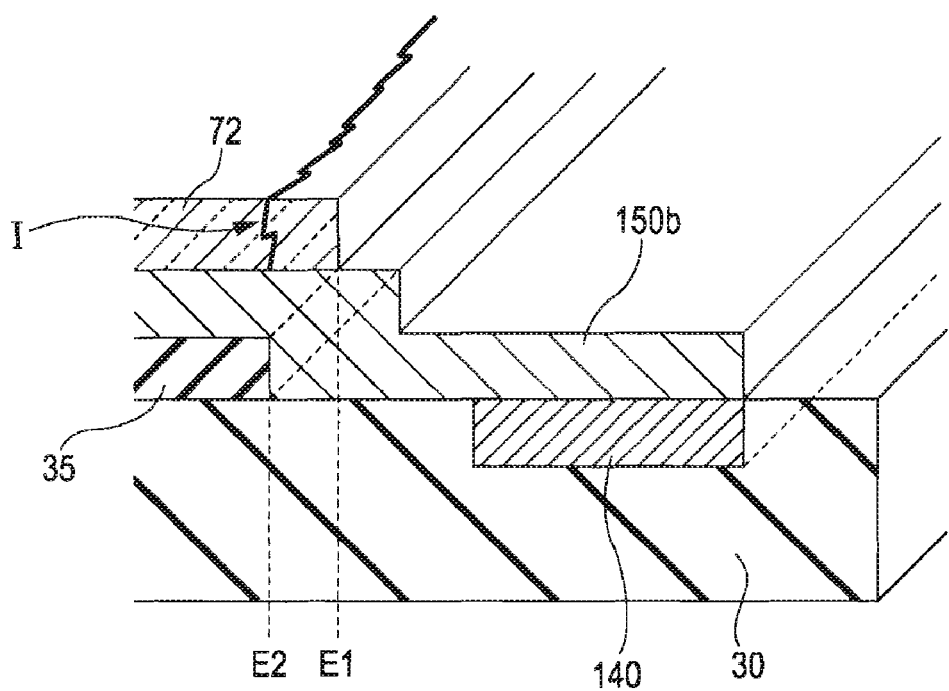
FIG. 6 is a view that shows a state where crack is formed in the common electrode in a comparative embodiment.

FIG. 6 is a view that shows a case, as a comparative embodiment, where the common electrode 72 is formed to overlap the end portion E2 of the second interlayer insulating film 35. As shown in FIG. 6, in this comparative embodiment, the end portion E1 of the common electrode 72 is arranged on the outer side than the end portion E2 of the second interlayer insulating film 35. As described above, the second interlayer insulating film 35 is mostly formed to be thick in order to planarize unevenness of the lower layer. Thus, the end portion E2 of the second interlayer insulating film 35 forms a large step. In contrast, the common electrode 72 is, for example, formed of a thin-film material, such as ITO. For this reason, in the configuration shown in the comparative embodiment there is a possibility that crack I shown in FIG. 6 may be formed in the common electrode 72 because of the influence of the step formed at the end portion E2 of the second interlayer insulating film 35. Once the crack I is formed, a resistance value increases at the cracked portion. Thus, the value of electric current that flows at a portion at which the crack I is formed differs from the value of electric current that flows at a portion at which no crack I is formed and, as a result, the amount of decrease in voltage is different. However, in the present embodiment, because the end portion E1 of the common electrode 72 is arranged on the inner side than the end portion E2 of the second interlayer insulating film 35, breakage or crack in the common electrode 72 may be prevented. Thus, it is possible to obviate an increase in resistance value due to breakage or crack. Thus, it is possible to suppress luminance non-uniformity of the light emitting elements 70.

A-2: Alternative Embodiment to First Embodiment

In the above described embodiment, the configuration in which the auxiliary electrode 150 and the pixel electrodes 76 are formed at the same time is described; however, the auxiliary electrode 150 may be formed not at the same time with the process of forming the pixel electrodes 76 but in the process after the partition wall 37 has been formed.

Figure 7:
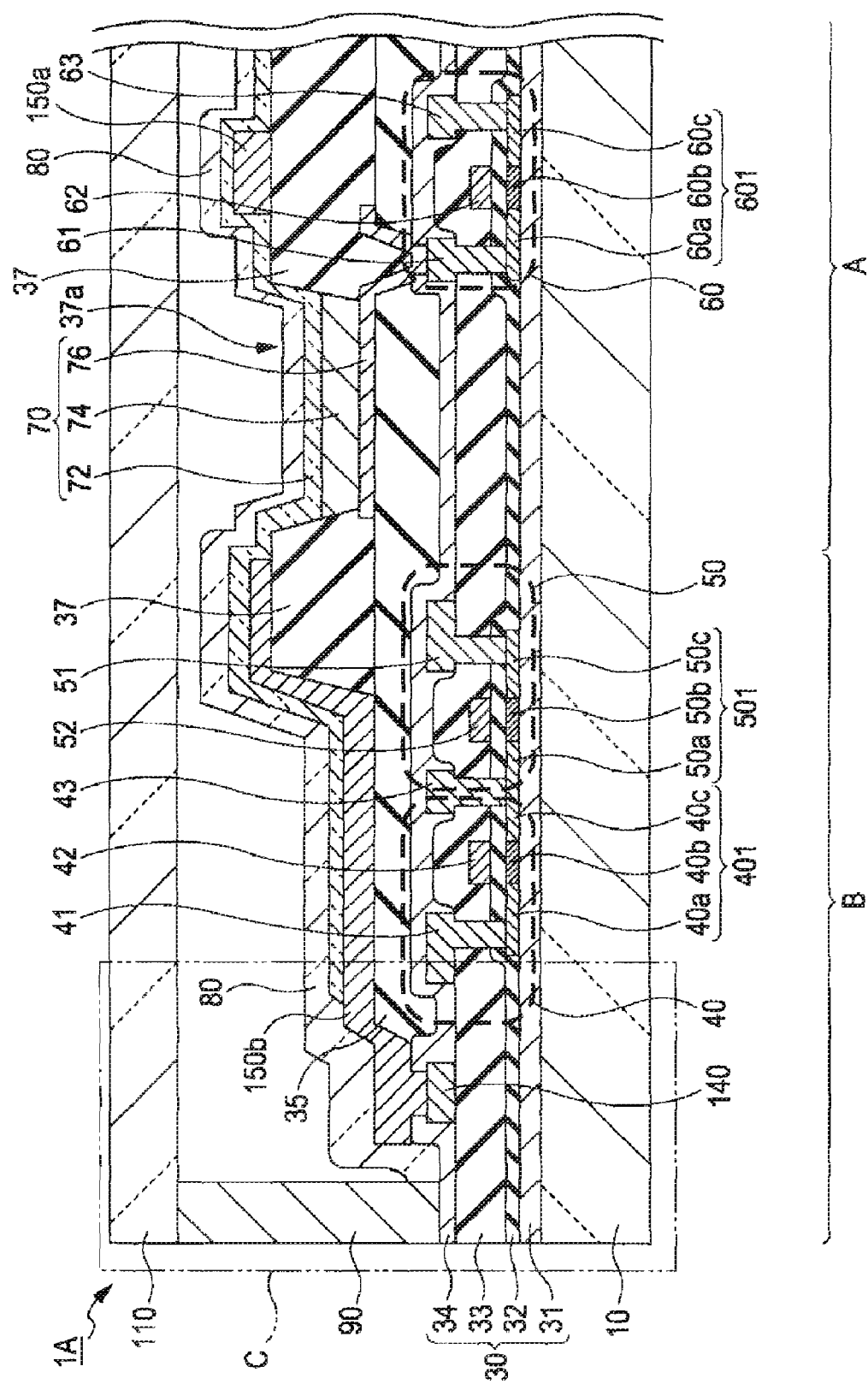
FIG. 7 is a partially cross-sectional view of a light emitting device according to an alternative embodiment to the first embodiment.

FIG. 7 is a partially cross-sectional view of a light emitting device 1A according to the present alternative embodiment. As shown in FIG. 7, in the light emitting device 1A, the auxiliary electrode 150 (150a, 150b) is formed to cover the second interlayer insulating film 35 and the partition wall 37. In the above described embodiment, as shown in FIG. 4, the auxiliary electrode 150 has a portion that is formed on the second interlayer insulating film 35 and the partition wall 37. In contrast, in this alternative embodiment, at a portion where the partition wall 37 is formed, the auxiliary electrode 150 is formed on the partition wall 37. Here, the partition wall 37, as well as the second interlayer insulating film 35, functions as an insulating layer that separates the common electrode 72 and the auxiliary electrode 150 from the transistors 40, 50, and 60. In addition, as in the case of the above described first embodiment, the end portion E4 of the auxiliary electrode 150 overlaps the second electrode power supply line 140, and the end portion E1 of the common electrode 72 is located on the inner side than the end portion E4 of the auxiliary electrode 150 and, in addition, located on the inner side than the end portion E2 of the second interlayer insulating film 35.

The schematic manufacturing process of the light emitting device 1A will be described below. After the second interlayer insulating film 35 has been formed, the pixel electrodes 76 are formed in an upper layer on the second interlayer insulating film 35. After that, the partition wall 37 is formed in an upper layer on the pixel electrodes 76, and the auxiliary electrode 150 is formed on the surface of the second interlayer insulating film 35 and the partition wall 37 except the openings 37a. Subsequently, the light emitting function layers 74 are formed in spaces defined by the partition wall 37 on the pixel electrodes 76 (that is, the openings 37a). Note that, conversely, the auxiliary electrode 150 may be formed after the light emitting function layers 74 have been formed. Furthermore, the common electrode 72 having a translucency is formed to extend over the effective region A and the peripheral region B. Thereafter, the sealing film 80 is formed on the common electrode 72. However, no sealing film 80 is formed at the outer periphery of the substrate 10 and, at the outer periphery, the seal 90 is bonded onto the circuit protection film 34 and the transparent sealing substrate 110 is further bonded thereon.

When the light emitting function layers 74 are formed after the auxiliary electrode 150 as been formed, because the light emitting function layers 74 are not formed at the time when the auxiliary electrode 150 is formed, there is no possibility that the light emitting function layers 74 are degraded even when the auxiliary electrode 150 is formed by means of photolithography. Thus, it is possible to form the pattern of the auxiliary electrode 150 by means of photolithography and, thereby, possible to form the auxiliary electrode 150 with the same accuracy as the transistors 40, 50, and 60 and wirings, such as the scanning lines 111. On the other hand, when the auxiliary electrode 150 is formed after the light emitting function layers 74 have been formed, it is advantageous in that the auxiliary electrode 150 and the common electrode 72 may be connected without contaminating the auxiliary electrode 150 with a light emitting material.

Furthermore, in the present alternative embodiment, because the common electrode 72 is formed in an upper layer on the auxiliary electrode 150, no stress is applied to the common electrode 72 even when the auxiliary electrode 150 having a thickness larger than the common electrode 72 is formed. Thus, deformation of the common electrode 72 due to stress applied from an upper layer may be suppressed.

B: Second Embodiment

Figure 8:
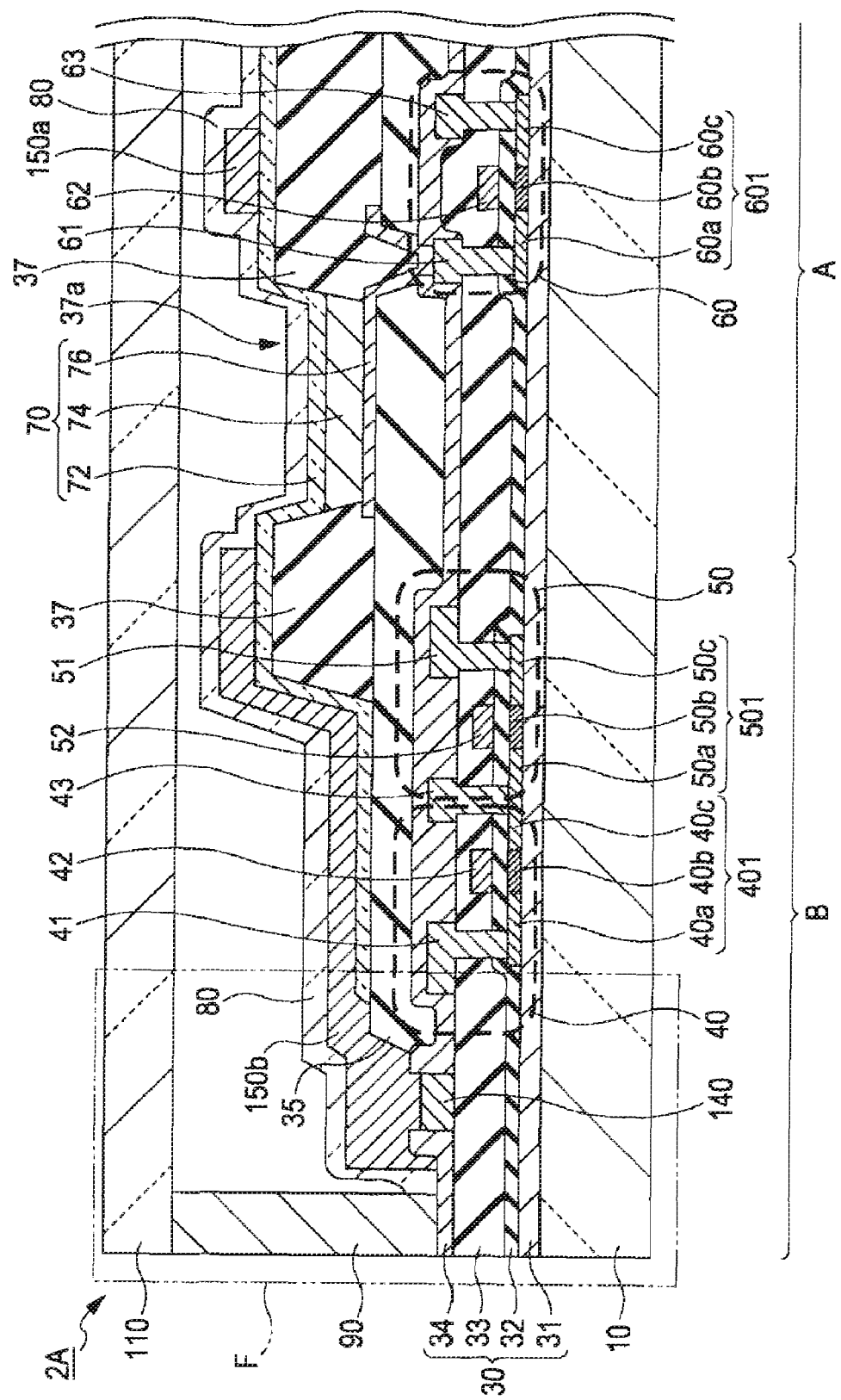
FIG. 8 is a partially cross-sectional view of a light emitting device according to a second embodiment of the invention.

Next, a light emitting device according to a second embodiment of the invention will be described. FIG. 8 is a partially cross-sectional view of a light emitting device 2A according to the present embodiment. As shown in FIG. 8, the auxiliary electrode 150 is formed on the common electrode 72 so as to be in plane contact, and the sealing film 80 is formed so as to cover the auxiliary electrode 150 and the common electrode 72. The light emitting device 2A has the same configuration as the light emitting device 1A, shove in FIG. 7, according to the first embodiment except that the common electrode 72 is formed in a lower layer under the auxiliary electrode 150. Thus, the description thereof will be omitted where appropriate.

As in the case of the above light emitting device 1A, in the present embodiment, the auxiliary electrode 150 is formed in an upper layer above the partition wall 37 at a portion where the partition wall 37 is formed. Here, the partition wall 37, as well as the second interlayer insulating film 35, functions as an insulating layer that separates the common electrode 72 and the auxiliary electrode 150 from the transistors 40, 50, and 60.

The schematic manufacturing process of the light emitting device 2A will be described below. After the second interlayer insulating film 35 has been formed, the pixel electrodes 76 are formed in an upper layer on the second interlayer insulating film 35. After that, the partition wall 37 is formed in an upper layer on the pixel electrodes 76, and the light emitting function layers 74 are respectively formed in spaces on the pixel electrodes 76 defined by the partition wall 37 (that is, the openings 37a). Furthermore, the transparent common electrode 72 is formed to extend over the effective region A and the peripheral region B. After that, the auxiliary electrode 150 is formed in a region on the common electrode 72 except the upper layers of the openings 37a, and then the sealing film 80 is formed. However, no sealing film 80 is formed at the outer periphery of the substrate 10 and, at the outer periphery, the seal 90 is bonded onto the circuit protection film 34 and the transparent sealing substrate 110 is further bonded thereon.

Figure 9:
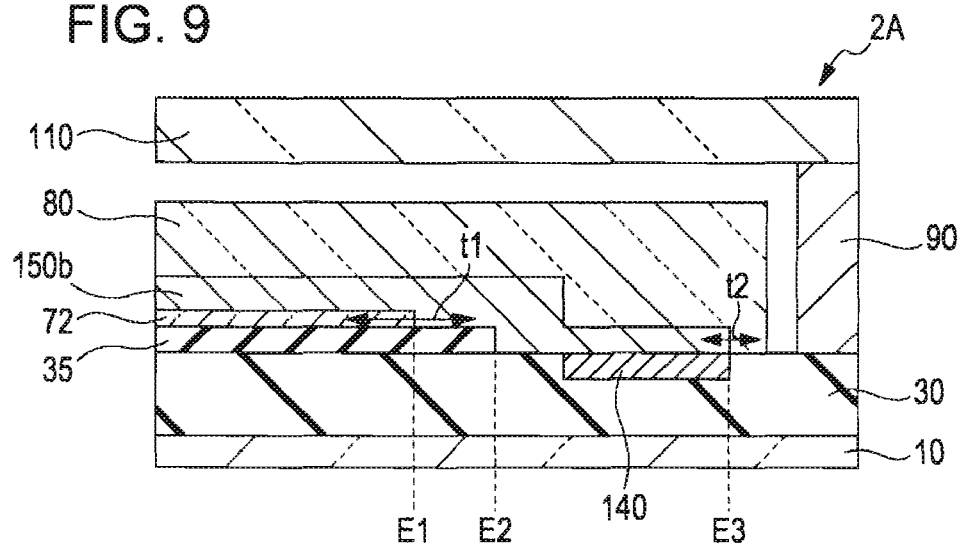
FIG. 9 is a partially schematic cross-sectional view of the light emitting device.

FIG. 9 is a partially schematic cross-sectional view of a region F shown in FIG. 8. As shown in FIG. 8 and FIG. 9, in the light emitting device 2A, on the outer side along the plane of the substrate 10 than the transistors 40 and 50, which are part of the scanning line driving circuit 100, the end portion E1 of the common electrode 72 is formed on the inner side than the end portion 52 of the second interlayer insulating film 35 and formed on the inner side than the end portion E4 of the auxiliary electrode 150. Thus, the same advantageous effects as those of the above first embodiment are obtained.

Figure 10:
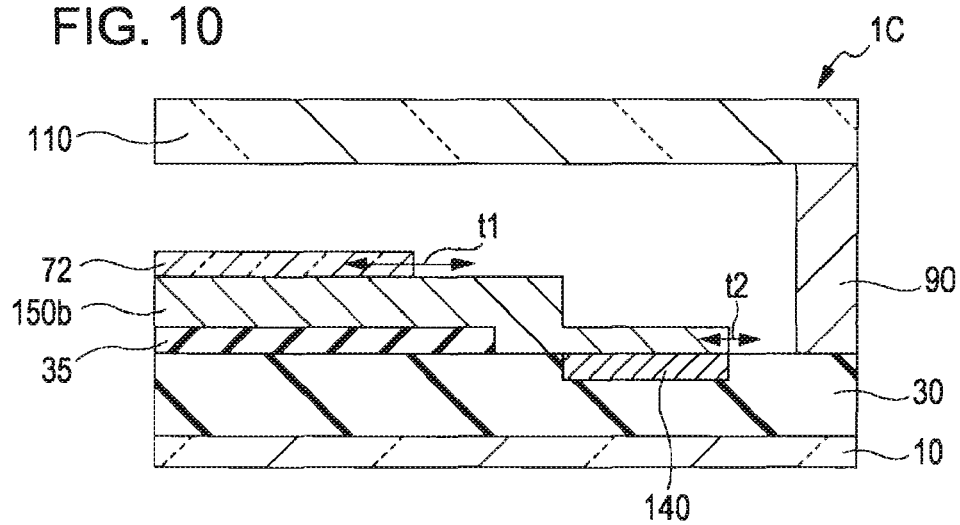
FIG. 10 is a partially schematic cross-sectional view of a light emitting device according to an alternative embodiment of the invention.
Figure 11:
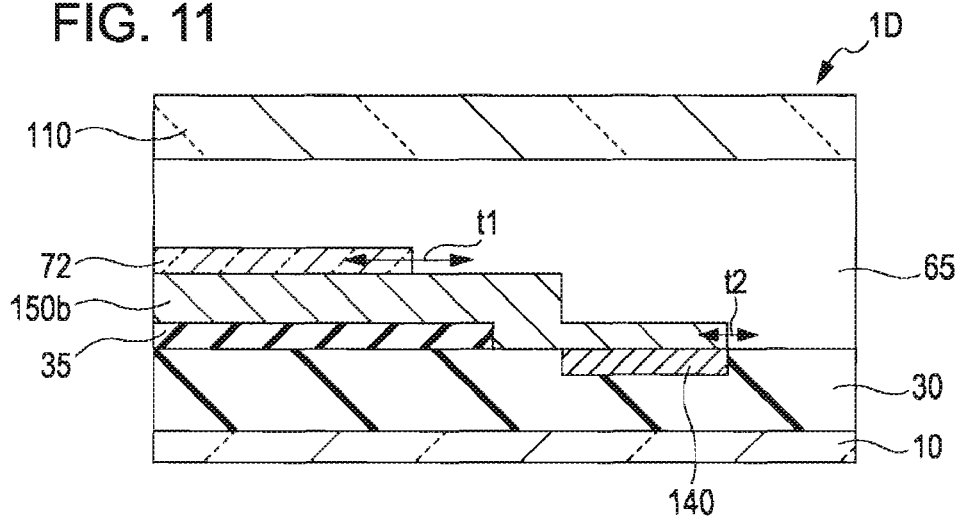
FIG. 11 is a partially schematic cross-sectional view of a light emitting device according to an alternative embodiment of the invention.

C: Alternative Embodiments (1) In the above first and second embodiments, by covering the common electrode 72 or the auxiliary electrode 150 using the sealing film 80 from an upper layer side, the layer structure that includes the element layer 30, the second electrode power supply line 140, the second interlayer insulating film 35, the common electrode 72 and the auxiliary electrode 150 from ambient air is protected; however, the sealing film 80 may be omitted from the above configuration. FIG. 10 is a schematic cross-sectional view of a light emitting device 1C according to an alternative embodiment. As shown in FIG. 10, in the light emitting device 1C, no sealing film 80 is provided, and the layer structure formed on the substrate 10 is protected by the seal 90 and the opposite substrate 110. Note that a desiccant (not shown) that adsorbs moisture may be arranged inside the opposite substrate 110, or a desiccant may be embedded in the opposite substrate 110 itself. In addition, a sealing can may be used in place of the opposite substrate 110 and the seal 90. FIG. 11 is a schematic cross-sectional view of another light emitting device 1D according to an alternative embodiment. As shown in FIG. 11, in the light emitting device 1D, by filling a moisture-proof filler 65 in between the opposite substrate 110 and the layer structure formed on the substrate 10, the layer structure is protected from ambient air. The moisture-proof filler 65 is desirably an optically transparent and low hygroscopic material and may employ an epoxy-based or an urethane-based adhesive, or the like.

Figure 12A:
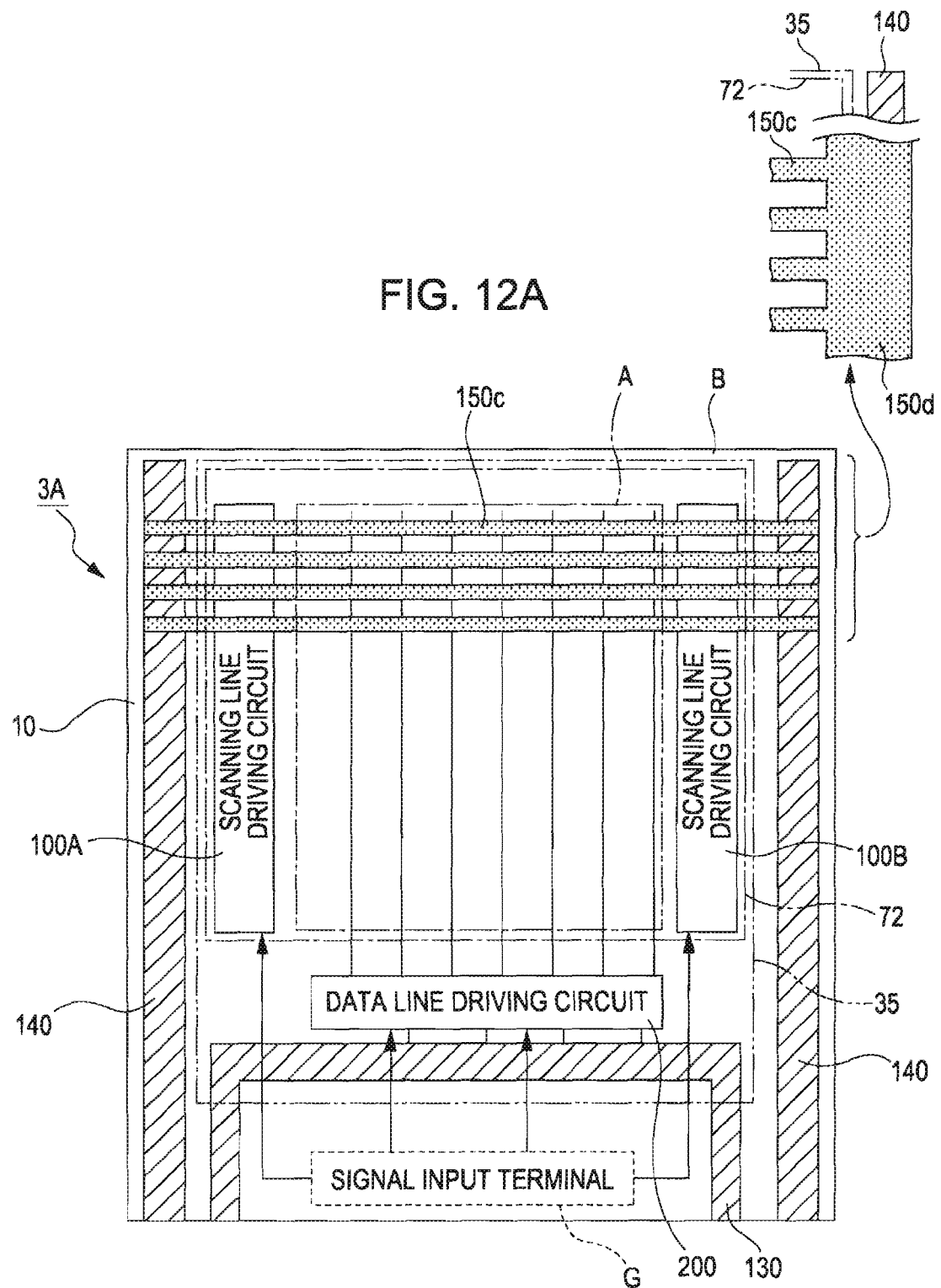
FIG. 12A and FIG. 12B each are the schematic layout of a light emitting device according to an alternative embodiment of the invention.
Figure 12B:
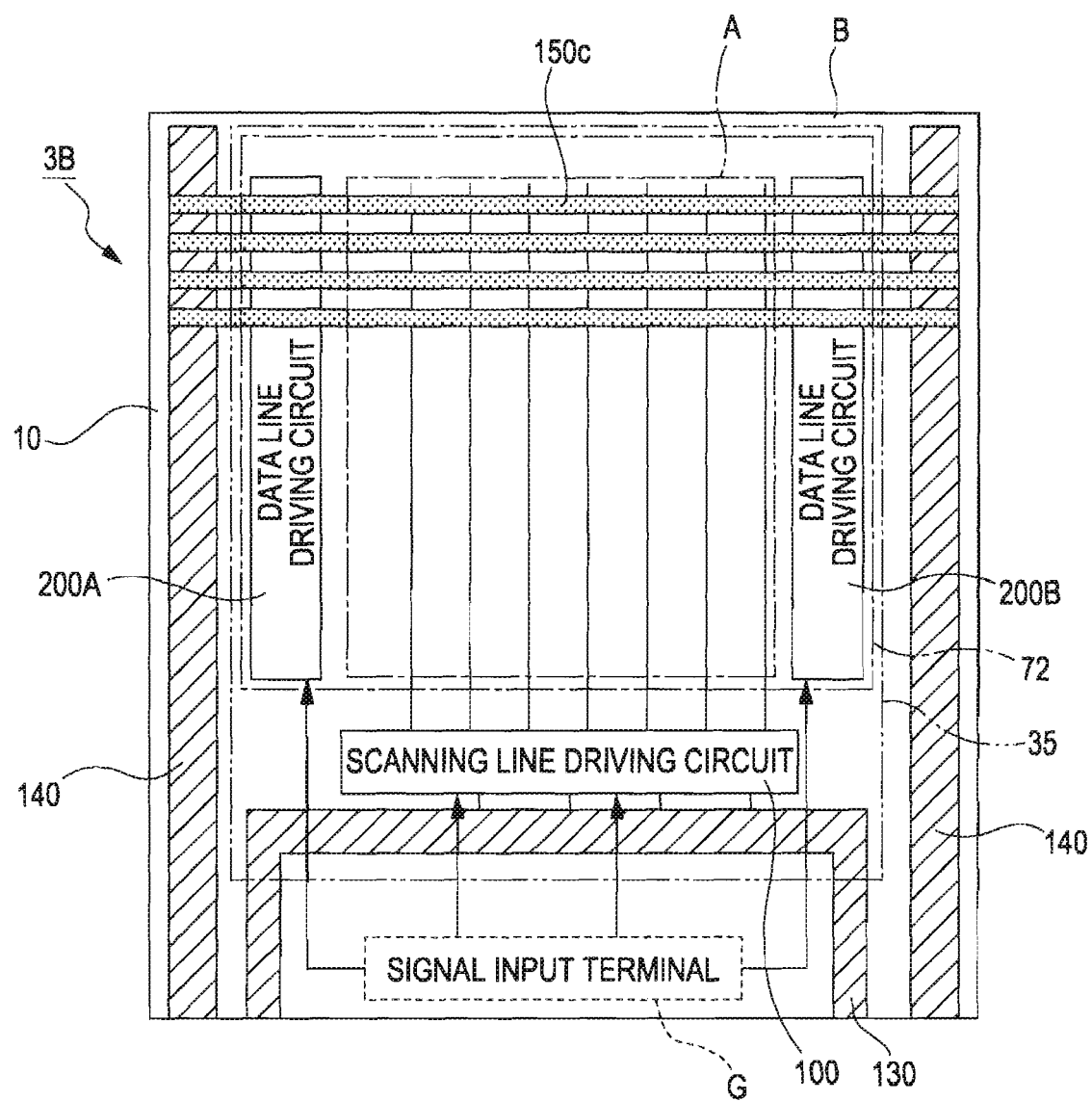
Figure 13A:
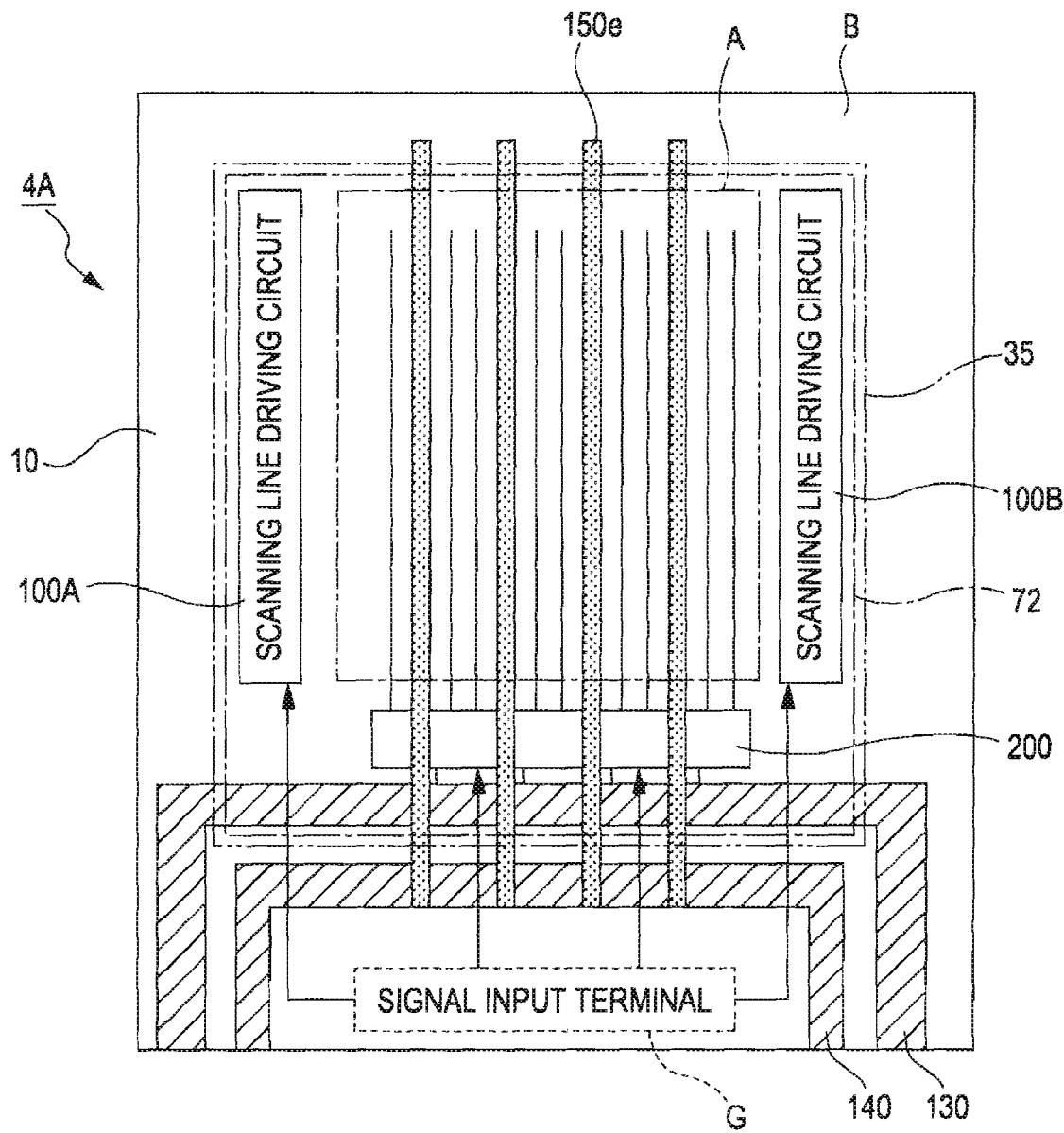
FIG. 13A and FIG. 13B each are a schematic layout of a light emitting device according to an alternative embodiment of the invention.
Figure 13B:
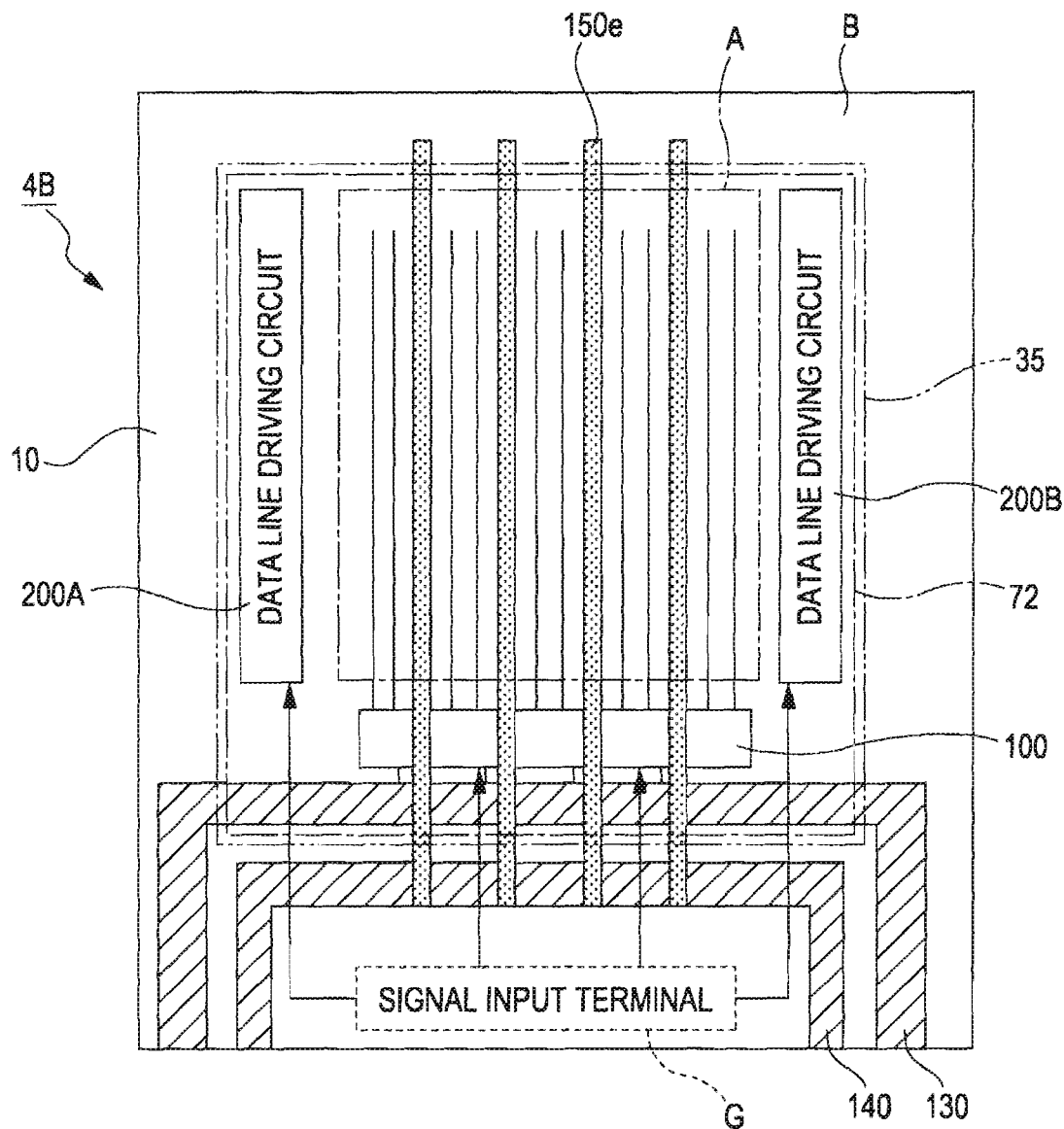

(2) In the above first and second embodiments, the configuration in which the second electrode power supply line 140 is formed in a U shape in the peripheral region B is described; however, the aspects of the invention are not limited to it but they may be modified appropriately. FIG. 12A and FIG. 12B each are the schematic layout of a light emitting device according to an alternative embodiment. FIG. 13A and FIG. 13B each are a schematic layout of a light emitting device according to an alternative embodiment. In these drawings, the same reference numerals are assigned to the components that are the same or similar to the above described embodiments, and the description thereof will be omitted.

As shown in FIG. 12A, in the light emitting device 3A, the second electrode power supply line 140 is arranged along each of the peripheries of two opposite sides of the substrate 10. Furthermore, a signal input terminal G is arranged in a region that is located along one side among the two remaining sides, and the first electrode power supply line 130 is arranged on the inner side along the plane of the substrate 10 than the signal input terminal G. The scanning line driving circuits 100A and 100B each are arranged along the effective region A on the inner side than the second electrode power supply line 140. The scanning line driving circuits 100A and 100B are supplied with power by the power supply line 140 and are supplied with control signals from the outside through the signal input terminal G. In addition, a data line driving circuit 200 is arranged along the effective region A on the inner side than the first electrode power supply line 130. The data line driving circuit 200 is supplied with power from the first electrode power supply line 130, while the data line driving circuit 200 receives control signals from the outside through the signal input terminal G and supplies them to the data lines.

In this example, the second interlayer insulating film 35 is formed to cover all the effective region A, the scanning line driving circuits 100A and 100B, and the data line driving circuit 200, and part of the first electrode power supply line 130 (that is, in the example shown in the drawing, when the side at which the signal input terminal G is arranged is defined to extend in a longitudinal direction, all the portion that extends in the longitudinal direction and part of portion that extends toward the lower side of the substrate 10 in a direction that intersects with the longitudinal direction). In addition, the common electrode 72 covers all the effective region A and the scanning line driving circuits 100A and 100B, the right and left end portions at which the second electrode power supply lines 140 are arranged are respectively located on the inner sides than the end portions of the second interlayer insulating film 35. Moreover, among the end portions of the common electrode 72, the lower side end portion (the side adjacent to the signal input terminal G) is located on the outer side of the effective region A and on the inner side than the data line driving circuit 200, and the upper side end portion is located on the inner side than the end portion of the second interlayer insulating film 35. That is, the end portions of four sides of the common electrode 72 are respectively located on the inner sides than the end portions of the corresponding sides of the second interlayer insulating film 35. In other words, the end portions of the second interlayer insulating film 35 extend outward beyond the end portions of the common electrode 72 at all the sides. That is, the second region covers the entire first region and extends outward beyond the first region at all the sides.

The auxiliary electrode is formed as striped individual electrodes 150c, each of which has the same longitudinal direction as the side at which the signal input terminal G is arranged. Specifically, each of the individual electrodes 150c extends through a gap formed between the adjacent light emitting elements 70 in the effective region A. In the peripheral region B, each of the individual electrodes 150c extends through a region that is located on the inner side than the first region, and a region that is located on the outer side than the first region and located on the inner side than the second region to the outer side than the second region, and extends to a region that overlaps the second electrode power supply line 140 to thereby be electrically connected to the second electrode power supply line 140. That is, the end portion of each of the individual electrodes 150c is located on the outer side than the end portion of the second interlayer insulating film 35 and located on the outer side than the end portion of the common electrode 72. Thus, the same advantageous effects as those of the above embodiment may be obtained with the present alternative embodiment.

Next, as shown in FIG. 12B, the light emitting device 3B has the same configuration as that of the light emitting device 3A except that the position of the scanning line driving circuit and the position of the data line driving circuit are exchanged. That is, in the light emitting device 3B, the scanning line driving circuit 100 is arranged at the lower side of the substrate 10 in the peripheral region B along the effective region A, and the data line driving circuits 200A and 200B are respectively arranged on the left and right sides of the substrate 10 in the peripheral region B. The second electrode power supply lines 140 are respectively arranged on the outer sides than the data line driving circuits 200A and 200B along two opposite sides (both the left and right sides) of the substrate 10, and the auxiliary electrodes 150 is formed in a stripe having a longitudinal direction that intersects with the second electrode power supply lines 140 (that is, in the same direction as the side at which the signal input terminal G is arranged). As in the case of the light emitting device 3A, each of the right and left end portions of the auxiliary electrode 150 is located on the outer side than the end portion of the common electrode 72 and located on the outer side than the end portion of the second interlayer insulating film 35, and is formed to overlap and contact the second electrode power supply line 140. Thus, the same advantageous effects as those of the above embodiments may be obtained with the light emitting device 3B.

Note that, in any one of the light emitting devices 3A and 3B, as shown on the right side in FIG. 12A, the auxiliary electrode 150 may be configured to include a plurality of individual electrodes 150c that are formed in a stripe and a connecting electrode 150d that is formed in the peripheral region B and connects the plurality of individual electrodes 150c. In this case, the connecting electrode 150d includes a portion that overlaps the inside of the first region and a portion that is located on the outer side than the first region and extends from a region located inside the second region to the outer side than the second region, and, moreover, is formed to overlap the second electrode power supply line 140. That is, the connecting electrode 150d is arranged so that not only the connecting electrode 150d overlaps the second electrode power supply line 140 but also the end portion of the second interlayer insulating film 35 and the end portion of the common electrode 72 overlap the connecting electrode 150d.

FIG. 13A and FIG. 13B each are an example of another layout of the light emitting device. As shown in FIG. 13A, in the light emitting device 4A, the signal input terminal G is arranged along the lower side periphery of the substrate 10, and the second electrode power supply line 140 is arranged on the inner side than the signal input terminal G in a U shape. Furthermore, the first electrode power supply line 130 is arranged on the inner side than the second electrode power supply line 140 in a U shape, and the data line driving circuit 200 is arranged between the power supply line 130 and the effective region A. The scanning line driving circuits 100A and 100B are respectively arranged in regions that are located along the left and right sides of the effective region A.

As shown in the drawing, the second interlayer insulating film 35 is formed to cover the entire effective region A, all the scanning line driving circuits 100A and 100B and the data line driving circuit 200, and part of the first electrode power supply line 130 (that is, in the example shown in the drawing, when the side at which the signal input terminal G is arranged is defined as a longitudinal direction, a portion that extends in the longitudinal direction). The common electrode 72 is formed to cover substantially the same portion as the second interlayer insulating film 35 covers and formed so that the end portions of four sides of the common electrode 72 are located on the inner sides than the corresponding end portions of the second interlayer insulating film 35. Thus, in the present alternative embodiment, at all the sides of the substrate 10, the second region in which the second interlayer insulating film 35 is formed extends beyond the first region in which the common electrode 72 is formed in a direction outward along the plane of the substrate 10.

As shown in the drawing, the auxiliary electrode is formed as striped individual electrodes 150e that extend in a direction, as a longitudinal direction, parallel to the scanning line driving circuits 100A and 100B. The end portion of each of the individual electrodes 150e on the lower end side of the substrate 10 is formed to overlap and contact the second electrode power supply line 140. Note that, in this example, the individual electrodes 150e intersect with the first electrode power supply line 130; however, by forming the first electrode power supply line 130 and the second electrode power supply line 140 with different layers from each other, the individual electrodes 150e are formed not to contact the first electrode power supply line 130 but to only contact the second electrode power supply line 140. Similarly, the common electrode 72 and the first electrode power supply line 130 overlap each other; however, by forming the first electrode power supply line 130 and the second electrode power supply line 140 with different layers from each other, it is possible to employ the configuration in which the common electrode 72 and the first electrode power supply line 130 are not electrically in contact with each other. On the other hand, the end portions of the individual electrodes 150e on the upper end side of the substrate 10 are formed to be located on the outer side than the end portion of the common electrode 72 and, in addition, located on the outer side than the end portion (second region) of the second interlayer insulating film 35. Thus, the same advantageous effects as those of the above embodiment may be obtained with the light emitting device 4A.

Next, as shown in FIG. 13B, the light emitting device 4B has the same configuration as that of the light emitting device 4A except that the position of the scanning line driving circuit and the position of the data line driving circuit are exchanged. That is, in the light emitting device 4B, the scanning line driving circuit 100 is arranged at the lower side of the substrate 10 in the peripheral region B along the effective region A, and the data line driving circuits 200A and 200B are respectively arranged in the peripheral region B on the left and right sides of the substrate 10. The second electrode power supply line 140 is arranged at the lower end side of the substrate 10 on the inner side than the signal input terminal G in a U shape, and the auxiliary electrode 150 is formed in a stripe having a longitudinal direction parallel to the data line driving circuits 200A and 200B. As in the case of the light emitting device 4A, each of the upper and lower end portions of the auxiliary electrode 150 is located on the outer side than the end portion of the common electrode 72 and located on the outer side than the end portion of the second interlayer insulating film 35, and the lower end portion is formed to overlap and contact the second electrode power supply line 140. Thus, the same advantageous effects as those of the above embodiments may be obtained with the light emitting device 4B.

As shown in FIG. 12A, FIG. 12B, FIG. 13A and FIG. 13B, in the peripheral region B, the auxiliary electrode 150 extends in a stripe in a direction that intersects with a direction in which the second electrode power supply line 140 extends. That is, in FIG. 1 to FIG. 3, the auxiliary electrode 150b also extends in a direction in which the second electrode power supply line 140 extends; however, the auxiliary electrode 150 may be formed to extend only in a direction that intersects with the direction in which the second electrode power supply line 140 extends. In other words, the auxiliary electrode 150 need not be formed parallel to a direction in which the second electrode power supply line 140 extends, but it is only necessary that the auxiliary electrode 150 is formed to intersect with the second electrode power supply line 140.

D: Electronic Apparatuses

Next, electronic apparatuses that use the light emitting device according to the aspects of the invention will be described. FIG. 14 to FIG. 16 are views that show embodiments of the electronic apparatuses that employ the light emitting device according to any one of the above described embodiments as a display device.

FIG. 14 is a perspective view of the configuration of a mobile personal computer that employs a light emitting device. The personal computer 2000 includes the light emitting device 1, 1A, 1C, 1D, 2A, 3A, 3B, 4A, or 4B, which displays various images, and a main body portion 2010, which has a power switch 2001 and a keyboard 2002 installed therein. The light emitting device 1, 1A, 1C, 1D, 2A, 3A, 3B, 4A, or 4B uses an organic light emitting diode element as the light emitting element 70, so that it is possible to display a screen that has a wide viewing angle and that is easily viewable.

FIG. 15 is a perspective view of the configuration of a cellular phone to which a light emitting device is applied. The cellular phone 3000 includes a plurality of operation buttons 3001, a plurality of scroll buttons 3002, and the light emitting device 1, 1A, 1C, 1D, 2A, 3A, 3B, 4A, or 4B, which displays various images. By manipulating the scroll buttons 3002, an image displayed on the light emitting device 1, 1A, 1C, 1D, 2A, 3A, 3B, 4A, or 4B is scrolled.

FIG. 16 is a perspective view of the configuration of a personal digital assistants to which a light emitting device is applied. The personal digital assistants 4000 includes a plurality of operation buttons 4001, a power switch 4002, and the light emitting device 1, 1A, 1C, 1D, 2A, 3A, 3B, 4A, or 4B, which displays various images. As the power switch 4002 is manipulated, various pieces of information, such as an address book and a schedule book, are displayed on the light emitting device 1, 1A, 1C, 1D, 2A, 3A, 3B, 4A, or 4B.

Note that the electronic apparatuses that employ the light emitting device according to the aspects of the invention include, in addition to the apparatuses shown in FIG. 14 to FIG. 16, a digital still camera, a television, a video camera, a car navigation system, a pager, an electronic personal organizer, an electronic paper, an electronic calculator, a word processor, a workstation, a video telephone, a POS terminal, a printer, a scanner, a photocopier, a video player, and devices provided with a touch panel display. However, applications of the light emitting device according to the aspects of the invention are not limited to image display. For example, in an image forming apparatus, such as an optical writing type printer or an electronic copying machine, an optical head (writing head) is used to expose a photoreceptor depending on an image to be formed on a sheet of paper. The light emitting device according to the aspects of the invention may be used as an optical head of this type.

The entire disclosure of Japanese Patent Application Nos: 2007-028843, filed Feb. 8, 2007 and 2007-319270, filed Dec. 11, 9007 are expressly incorporated by reference herein.

What is claimed is:

1. A light emitting device comprising:
a substrate on which an effective region and a peripheral region that surrounds the effective region are provided;
a plurality of light emitting elements are arranged in the effective region, wherein each of the light emitting elements includes a first electrode, a second electrode and a light emitting layer located between the first electrode and the second electrode, wherein the second electrode is commonly provided for the plurality of light emitting elements;
an element layer in which a circuit element is arranged to control emission of light of the light emitting elements;
an auxiliary electrode that is electrically connected to the second electrode; and
an insulating layer that has a portion that is arranged in an upper layer on the element layer and arranged in a lower layer under the second electrode and the auxiliary electrode, wherein the insulating layer insulates the second electrode and the auxiliary electrode from the circuit element, wherein
the second electrode covers the effective region and is formed uniformly so as to extend into the peripheral region, wherein the auxiliary electrode extends through a gap between the plurality of adjacent light emitting elements in the effective region and is formed partly in the peripheral region, and wherein in the peripheral region, an end portion of the second electrode is located on an inner side along a plane of the substrate than an end portion of the auxiliary electrode and an end portion of the insulating layer.

2. The light emitting device according to claim 1, wherein the second electrode is arranged in a lower layer under the auxiliary electrode.

3. A light emitting device comprising:
a substrate on which an effective region and a peripheral region that surrounds the effective region are provided;
a plurality of light emitting elements are arranged in the effective region;
a plurality of first electrodes that are provided at positions corresponding to the plurality of light emitting elements;
a second electrode that is provided commonly for the plurality of light emitting elements;
a light emitting layer that is interposed between the plurality of first electrodes and the second electrode;
an auxiliary electrode that is electrically connected to the second electrode;
an element layer in which a circuit element that controls emission of light of the light emitting elements is arranged; and
an insulating layer that insulates the second electrode or the auxiliary electrode from the element layer, wherein
the second electrode is provided in a first region that includes the entire effective region and at least part of the peripheral region, wherein
the insulating layer is provided in a second region that overlaps the first region over the entire effective region and that extends beyond the first region in a first direction in the peripheral region, wherein
the auxiliary electrode is provided to extend through a gap formed between the adjacent light emitting elements in the effective region, and wherein, in the peripheral region, the auxiliary electrode is provided inside the first region and provided to extend through a region, which is located on the outer side than the first region and inside the second region, outward beyond the second region.

4. The light emitting device according to claim 3, wherein
the plurality of light emitting elements are arranged in a matrix, and wherein
the auxiliary electrode includes a plurality of individual electrodes that are provided in a stripe along a first direction so as to extend through a gap formed between the plurality of adjacent light emitting elements from an inside of the effective region outward beyond the effective region.

5. The light emitting device according to claim 4, wherein the auxiliary electrode further includes a connecting electrode in the peripheral region, and wherein the connecting electrode connects the plurality of individual electrodes.

6. The light emitting device according to claim 5, wherein the connecting electrode is arranged so that an end portion of the insulating layer in the first direction overlaps the connecting electrode.

7. The light emitting device according to claim 6, wherein
the plurality of light emitting elements are arranged in a matrix, and wherein
the auxiliary electrode includes a plurality of individual electrodes that are provided in a stripe along the first direction so as to extend through a gap formed between the plurality of adjacent light emitting elements from an inside of the effective region outward beyond the second region.

8. The light emitting device according to claim 3, further comprising:
a second electrode power supply line that supplies an electric potential to the second electrode and that is provided in the peripheral region so as to intersect with the first direction, wherein
the second electrode power supply line is electrically connected to the auxiliary electrode.

9. The light emitting device according to claim 8, wherein the second electrode power supply line is provided on an outer side than the first region.

10. An electronic apparatus comprising the light emitting device according claim 1.

* * * * *